US008859046B2

(12) United States Patent
Nakamura et al.

(10) Patent No.: US 8,859,046 B2
(45) Date of Patent: Oct. 14, 2014

(54) SUBSTRATE PROCESSING APPARATUS, CONTROL METHOD ADOPTED IN SUBSTRATE PROCESSING APPARATUS AND PROGRAM

(75) Inventors: Hiroshi Nakamura, Yamanashi (JP); Toshiyuki Kobayashi, Miyagi (JP); Shinichiro Hayasaka, Miyagi (JP); Seiichi Kaise, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/271,050

(22) Filed: Oct. 11, 2011

(65) Prior Publication Data

US 2012/0046774 A1 Feb. 23, 2012

Related U.S. Application Data

(62) Division of application No. 11/348,323, filed on Feb. 7, 2006, now abandoned.

(60) Provisional application No. 60/655,425, filed on Feb. 24, 2005, provisional application No. 60/702,990, filed on Jul. 28, 2005.

(30) Foreign Application Priority Data

Feb. 8, 2005 (JP) ................................. 2005-032340
Jul. 15, 2005 (JP) ................................. 2005-206376

(51) Int. Cl.
*G06F 19/00* (2011.01)
*G05D 7/06* (2006.01)
*H01L 21/67* (2006.01)

(52) U.S. Cl.
CPC ...... *H01L 21/6719* (2013.01); *H01L 21/67017* (2013.01)
USPC ....... 427/255.28; 700/100; 422/105; 423/210

(58) Field of Classification Search
USPC .................................................. 700/100, 108
See application file for complete search history.

(56) References Cited

U.S. PATENT DOCUMENTS

| 4,325,921 A | 4/1982 | Aiken et al. .................. 423/210 |
| 5,704,214 A | 1/1998 | Fujikawa et al. .............. 62/55.5 |

(Continued)

FOREIGN PATENT DOCUMENTS

| JP | 9-7912 | 1/1997 |
| JP | 11-008200 | 1/1999 |

(Continued)

OTHER PUBLICATIONS

Office Action issued Apr. 13, 2011, in Japan Patent Application No. 2005-206376.

*Primary Examiner* — Parviz Hassanzadeh
*Assistant Examiner* — Nathan K Ford
(74) *Attorney, Agent, or Firm* — Oblon, Spivak, McClelland, Maier & Neustadt, L.L.P.

(57) ABSTRACT

A substrate processing apparatus according to the present invention comprises a plurality of processing chambers, discharge systems each provided in conjunction with one of the processing chambers and a common discharge system connected with the discharge systems of at least two processing chambers among the discharge systems provided in conjunction with the individual processing chambers. The common discharge allows a switch-over between a scrubbing common discharge system that discharges discharge gas from each processing chamber after scrubbing the discharge gas at a scrubbing means and a non-scrubbing common discharge system that directly discharges the discharge gas from the discharge system of the processing chamber without scrubbing at the scrubbing means. In this substrate processing apparatus, switch-over control is executed to select either the scrubbing common discharge system of the non-scrubbing common discharge system in correspondence to the type of processing executed in the processing chamber.

12 Claims, 24 Drawing Sheets

(56) References Cited

U.S. PATENT DOCUMENTS

| | | | |
|---|---|---|---|
| 6,258,169 B1 | 7/2001 | Asano | 118/697 |
| 6,572,924 B1 | 6/2003 | Halpin | 427/255.28 |
| 7,278,831 B2 * | 10/2007 | Bailey et al. | 417/248 |
| 2002/0073923 A1 | 6/2002 | Saito et al. | 118/715 |
| 2005/0034767 A1 | 2/2005 | Reimer et al. | 137/565.23 |
| 2006/0147626 A1 * | 7/2006 | Blomberg | 427/248.1 |

FOREIGN PATENT DOCUMENTS

| | | |
|---|---|---|
| JP | 2001-60555 | 3/2001 |
| JP | 2001-345270 | 12/2001 |
| JP | 2004-095643 | 3/2004 |

* cited by examiner

FIG.10

| PROCESSING CHAMBER | FIRST PROCESSING | SECOND PROCESSING |
|---|---|---|
| 200A | 0 | 0 |
| 200B | 1 | 0 |
| 200C | 0 | 0 |
| 200D | 0 | 0 |

| PROCESSING CHAMBER | PROCESSING TYPE |
|---|---|
| 200A | FIRST PROCESSING |
| 200C | FIRST PROCESSING |
| 200D | FIRST PROCESSING |
|  |  |
|  |  |

494

SUBSTRATE PROCESSING APPARATUS, CONTROL METHOD ADOPTED IN SUBSTRATE PROCESSING APPARATUS AND PROGRAM

CROSS REFERENCE TO RELATED APPLICATIONS

This application is a division of application Ser. No. 11/348,323, filed Feb. 7, 2006, now abandoned and claims priority to Japanese Patent Application No. 2005-032340 filed Feb. 8, 2005, Japanese Patent Application No. 2005-206376 filed Jul. 15, 2005, U.S. Provisional Application No. 60/655,425 filed Feb. 24, 2005, and U.S. Provisional Application No. 60/702,990 filed Jul. 28, 2005, the entire contents of which are hereby incorporated by reference.

FIELD OF THE INVENTION

The present invention relates to a substrate processing apparatus that includes a scrubbing device for scrubbing discharge gas that is discharged while a substrate such as a semiconductor wafer or a liquid crystal substrate is processed, a control method to be adopted in a substrate processing apparatus and a program.

BACKGROUND OF THE INVENTION

Substrate processing apparatuses include plasma processing apparatuses that execute processing such as film formation and etching by using specific types of gases on substrates such as semiconductor wafers (hereafter may be referred to simply as "wafers") placed inside processing chambers or clean the inside of the processing chambers with a specific type of gas.

The discharge gas discharged from a processing chamber of such a substrate processing apparatus may be toxic or may contain a substance that places a heavy burden on the environment. Thus, it would be detrimental to the environment to directly release the discharge gas into the atmosphere. This issue is addressed in some substrate processing apparatuses by releasing the discharge gas from a processing chamber via a scrubbing device that scrubs (eliminates noxious elements in) the discharge gas through a heat treatment or the like.

For instance, the substrate processing apparatus shown in FIG. 24 includes scrubbing devices 20A and 20B respectively provided in conjunction with processing chambers 10A and 10B. In this substrate processing apparatus, the scrubbing devices 20A and 20B respectively connected with discharge systems 12A and 12B for the individual processing chambers 10A and 10B scrub the discharge gas from the processing chambers 10A and 10B. This type of substrate processing apparatus, which requires as many scrubbing devices as processing chambers, is bound to take up a large installation space and its manufacturing costs are bound to be high.

These problems are addressed by adopting a structure such as that shown in FIG. 25, which includes a common discharge system 31 connected with discharge systems 12A and 12B of the individual processing chambers 10A and 10B, with the common discharge system 31 connected with a scrubbing device 30 to serve both the processing chambers 10A and 10B so as to scrub the discharge gas from the processing chambers 10A and 10B through a single scrubbing device 30 (see, for instance, Japanese Laid Open Patent Publication No. H11-8200 and Japanese Laid Open Patent Publication No. 2004-95643).

SUMMARY OF THE INVENTION

The processing executed in the individual processing chambers may include discharge processing executed at a relatively high pressure, such as roughing vacuum processing executed prior to wafer processing in the processing chamber to reduce the pressure in the processing chamber from atmospheric pressure (one atmosphere) to a predetermined level. Since such roughing vacuum processing is executed before the processing gas is drawn into the processing chambers, it does not necessitate discharge gas scrubbing.

However, the discharge gas from each processing chamber in the structure shown in FIG. 24 or 25 is invariably scrubbed via the scrubbing device and is then discharged, regardless of the type of processing executed in the processing chamber. This means that the gas discharged through the roughing vacuum processing or the like, which is discharged under high pressure conditions and does not require scrubbing, too, has to first undergo scrubbing via the scrubbing device before it is released. As a result, the onus placed on the scrubbing device increases, which leads to a reduced service life of the scrubbing device.

In addition, the significant increase in the size of substrates to undergo processing, such as wafers and liquid crystal panels seen in recent years has necessitated an increase in the size of processing chambers. This, in turn, has resulted in a great increase in the quantities of discharge gas discharged from the processing chambers, and ultimately a greater onus on scrubbing devices.

Furthermore, since the discharge gas is scrubbed through, for instance, a heat treatment at a scrubbing device, the level of energy required for the discharge processing rises as the number of scrubbing devices included in the processing system increases. As a result, the energy efficiency at the plant where such substrate processing apparatuses are installed is lowered and the level of energy consumption at the entire plant rises. Accordingly, from the viewpoint of improving the overall energy efficiency and the overall cost efficiency at the plant, it is crucial to scrub discharge gas while economizing on energy consumption.

This leads to the conclusion that it is more desirable to use fewer scrubbing devices, i.e., it is more desirable to use a common scrubbing device to serve multiple processing chambers, as shown in FIG. 25, than to provide a scrubbing device in correspondence to each of the processing chambers, as shown in FIG. 24. However, in the structure shown in FIG. 25, all the discharge gas from the plurality of processing chambers is gathered into the common scrubbing device and thus, if concurrent processing is executed at the individual processing chambers, the onus on the scrubbing device may increase depending upon the types of processing executed in the processing chambers.

Accordingly, an object of the present invention, having been completed by addressing the problems of the related art discussed above, is to provide a substrate processing apparatus, a control method to be adopted in a substrate processing apparatus and a program, which reduce the onus on a scrubbing means for scrubbing the discharge gas and also reduce the energy and the cost required for the discharge gas scrubbing.

The object described above is achieved in an aspect of the present invention by providing a substrate processing apparatus comprising a plurality of processing chambers in each of which a specific type of processing is executed by using gas supplied thereto, discharge systems each provided in conjunction with one of the processing chambers and a common discharge system connected with the discharge systems of at least two processing chambers among the discharge systems provided in conjunction with the individual processing chambers. The common discharge system in this substrate processing apparatus allows a switch-over between a scrubbing common discharge system that discharges discharge gas from the discharge system of each processing chambers after scrubbing the discharge gas at a scrubbing means and a non-scrubbing common discharge system that directly discharges the discharge gas from the discharge systems of the processing chamber without scrubbing at the scrubbing means, and the substrate processing apparatus further includes a control means that executes switch-over control to select either the scrubbing common discharge system or the non-scrubbing common discharge system in correspondence to the type of processing executed at the processing chamber.

The object described above is achieved in another aspect of the present invention by providing a control method to be adopted in a substrate processing apparatus comprising a plurality of processing chambers in each of which a specific type of processing is executed by using a gas supplied thereto, discharge systems each provided in correspondence to one of the processing chambers and a common discharge system connected with the discharge systems of at least two processing chambers among the discharge systems provided in conjunction with the individual processing chambers, with the common discharge system allowing a switch-over between a scrubbing common discharge system that discharges discharge gas from the discharge system of each processing chamber after scrubbing the discharge gas at a scrubbing means and a non-scrubbing common discharge system that directly discharges the discharge gas from the discharge system of the processing chamber without scrubbing at the scrubbing means. In this control method, switch-over control is executed to select either the scrubbing common discharge system or the non-scrubbing common discharge system in correspondence to the type of processing executed at the processing chamber.

By adopting the apparatus or the control method according to the present invention described above, switch-over control is executed to select the scrubbing common discharge system or the non-scrubbing common discharge system in correspondence to the types of processing executed at the individual processing chambers and thus, the non-scrubbing common discharge system can be selected in correspondence to, for instance, roughing vacuum processing during which a gas that does not need to be scrubbed is discharged under high pressure conditions so as to release the gas without scrubbing at the scrubbing means. As a result, the onus on the scrubbing means for scrubbing discharge gas is reduced and the energy and the cost required for the discharge gas scrubbing are also reduced.

In the apparatus or the control method described above, a specific type of exclusivity control may be executed when concurrent processing is executed in the plurality of processing chambers connected to the common discharge system so that while either first processing constituted with processing executed by switching the common discharge system to the non-scrubbing common discharge system (e.g., roughing vacuum processing executed to reduce the pressure from atmospheric pressure, which does not require discharge gas scrubbing) or second processing constituted with processing executed by switching the common discharge system to the scrubbing common discharge system (e.g., processing one a substrate, which requires discharge gas scrubbing) is in progress in one of the plurality of processing chambers, the other type of processing is not executed in any remaining processing chamber among the plurality of processing chambers. By taking these measures, it is ensured that the first processing and the second processing are not simultaneously executed in different processing chambers. As a result, failure to scrub discharge gas requiring scrubbing can be reliably prevented while, at the same time, reducing the onus on the scrubbing means.

The apparatus described above may include, or the control method described above may employ, an access right reservation information storage means for storing reservation information with regard to an access right of a given processing chamber to the common discharge system. When either the first processing or the second processing is to be executed in a processing chamber among the plurality of processing chambers connected to the common discharge system, the exclusivity control for the individual processing chambers may be executed in conjunction with the access right reservation information storage means by making a decision as to whether or not one type of processing, i.e., either the first processing or the second processing, is currently being executed in any of the other processing chambers among the plurality of processing chambers connected with the common discharge system, executing the other type of processing if the one type of processing is judged not to be in progress in the other processing chambers, and executing reservation processing if the one type of processing is judged to be in progress in any of the other processing chambers. Through the reservation processing, the other type of processing is set in a processing wait state, access right reservation information for the one type of processing with regard to an access right to the common discharge system is stored into the access right reservation information storage means and then the other type of processing is subsequently based upon the reservation information in the access right reservation information storage means. The reservation processing enables execution of the other type of processing in the processing chamber having been set in the processing wait state, after the one type of processing in the other processing chamber is completed. Through such reservation processing, processing can be automatically executed in the processing chamber having been set in the processing wait state.

If a plurality of sets of reservation information indicating access right reservations for the common discharge system corresponding to a plurality of processing chambers have been stored in the access right reservation information storage means, the reservation processing may enable execution of the other type of processing in the order in which the individual sets of reservation information have been stored. In this case, if reservations for the common discharge system are made in correspondence to a plurality of processing chambers, the processing in the individual chambers can be executed in the order in which the reservations are registered.

In the apparatus or the control method described above, the first processing may be, for instance, processing that includes at least processing through which the subject processing chamber is discharged to a pressure level equal to or greater than a predetermined level without requiring discharge gas scrubbing and the second processing may be processing that includes at least processing that generates discharge gas requiring scrubbing. When the first processing and the second processing defined as such are executed under the control described above, the discharge gas discharged under high pressure conditions is not released via the scrubbing means and the discharge gas that needs to be scrubbed is never released without first being scrubbed at the scrubbing means. The onus on the scrubbing means in such an apparatus or in such a control method is thereby reduced The first processing executed in the apparatus or through the control method may be, for instance, roughing vacuum processing in the subject processing chamber or processing that includes the roughing vacuum processing (e.g., automatic inspection processing or maintenance processing for the processing chamber during which roughing vacuum processing is executed as part thereof). The second processing may be, for instance, processing gas supply processing that necessitates discharge of the processing chamber or processing that includes the processing gas supply processing (e.g., automatic inspection processing or maintenance processing during which processing gas supply processing is executed as part thereof). Since automatic inspection processing or maintenance processing may include roughing vacuum processing or processing gas supply processing, the execution of exclusivity control on the first processing and the second processing in conjunction with such automatic inspection processing or maintenance processing will reduce the onus on the scrubbing means while reliably preventing any discharge gas requiring scrubbing from being released without first going through the process of scrubbing.

In the apparatus or the control method described above, the first processing and the second processing may both be the roughing vacuum processing at the processing chamber or processing that includes the roughing vacuum processing. In this case, simultaneous execution of, for instance, roughing vacuum processing at different processing chambers can be prevented and thus, the discharge gas from roughing vacuum processing requiring scrubbing is not directly released without first being scrubbed. At the same time, the reverse flow of the discharge gas due to the difference between the pressure levels at the individual processing chambers attributable to the difference in the timing with which the roughing vacuum processing starts at the individual processing chambers can be reliably prevented.

In the apparatus or the control method described above, a gas supply system through which gas is supplied into the processing chambers may include a processing gas supply system for supplying a processing gas and an inert gas supply system for supplying an inert gas. The inert gas supply system may, in turn, include a first supply system through which the inert gas can be supplied at a predetermined flow rate and a second supply system through which the inert gas can be supplied at a flow rate higher than the flow rate set for the first supply system. When inert gas supply processing is executed at a low flow rate via the first supply system, the subject processing chamber can be discharged via the scrubbing means by switching to the scrubbing common discharge system, whereas when inert gas supply processing is executed at a high flow rate via the second supply system, the processing chamber can be discharged by switching to the non-scrubbing common discharge system so as to allow the discharge gas to be released without being scrubbed at the scrubbing means. Consequently, the onus on the discharge device can be reduced.

When executing particle reduction processing in the processing chamber in the apparatus or the control method, the inert gas may be supplied at least via the second supply system. During particle reduction processing, roughing vacuum processing, through which the processing chamber is discharged initially at a high pressure level without requiring the discharge gas to be scrubbed, may be executed and the discharge gas resulting from such processing can be released by switching to the non-scrubbing common discharge system without scrubbing the discharge gas at the scrubbing means. Thus, the onus on the scrubbing means for discharge gas scrubbing can be reduced, and the energy and the cost required for discharge gas scrubbing can also be reduced. In addition, regardless of whether the inert gas is continuously supplied or briefly supplied for the particle reduction processing, gas shock waves generated under specific conditions by supplying the inert gas at a high flow rate via the second supply system can be used to clean the interior of the processing chamber.

The processing chamber may be cleaned by initially supplying the inert gas at least via the second supply system over a predetermined length of time and then supplying the inert gas entirely via the first supply system. A gas shock wave, generated under specific conditions by briefly supplying the inert gas into the processing chamber at a high flow rate over a predetermined length of time, can then be used to clean the interior of the processing chamber. In addition, even if the inert gas is discharged through the scrubbing common discharge system via the scrubbing means, the inert gas will be discharged at a high flow rate only briefly, and thus, the onus on the scrubbing device is not increased.

The object described above is also achieved in yet another aspect of the present invention by providing a program to be used to control a substrate processing apparatus comprising a plurality of processing chambers in each of which a specific type of processing is executed by using a gas supplied thereto, discharge systems each provided in correspondence to one of the processing chambers and a common discharge system connected with the discharge systems of at least two processing chambers among the discharge systems provided in conjunction with the individual processing chambers, common discharge system allowing a switch-over between a scrubbing common discharge system that discharges discharge gas from the discharge system of each processing chambers after scrubbing the discharge gas at a scrubbing means and a non-scrubbing common discharge system that directly discharges the discharge gas from the discharge system of the processing chamber without scrubbing the discharge gas at the scrubbing means. The program enables a computer to execute switch-over control between the scrubbing common discharge system and the non-scrubbing common discharge system in correspondence to the type of processing executed at each processing chamber. By executing this program, the onus on the scrubbing means can be reduced.

If processing is concurrently executed at the plurality of processing chambers connected with the common discharge system, the program may enable execution of a specific type of exclusivity control so that while either first processing constituted with processing executed by switching the common discharge system to the non-scrubbing common discharge system or second processing constituted with processing executed by switching the common discharge system to the scrubbing common discharge system is in progress in one of the plurality of processing chambers, the other type of processing is not executed in any of the remaining processing chambers among the plurality of processing chambers. By executing this program, it is ensured that the first processing and the second processing are not simultaneously executed in different processing chambers. As a result, failure to scrub discharge gas requiring scrubbing can be reliably prevented while, at the same time, reducing the onus on the scrubbing means.

According to the present invention, the onus on the scrubbing means for scrubbing discharge gas can be reduced, and the energy and the cost required for the discharge gas scrubbing can both be reduced. In addition, when processing is to be executed concurrently at a plurality of processing chambers, the switch-over between the non-scrubbing common discharge system and the scrubbing common discharge system is not allowed to occur while the one type of processing is in progress. As a result, any discharge gas requiring scrubbing is always discharged as scrubbed gas without fail, while reducing the onus placed on the scrubbing means.

BRIEF DESCRIPTION OF THE DRAWINGS

FIG. 10 presents a specific example of a data table holding the processing status management information used in the embodiment;

FIG. 11 presents a specific example of a data table holding the scrubbing device access right reservation information used in the embodiment;

DETAILED DESCRIPTION OF THE PREFERRED EMBODIMENTS

Figure 1:
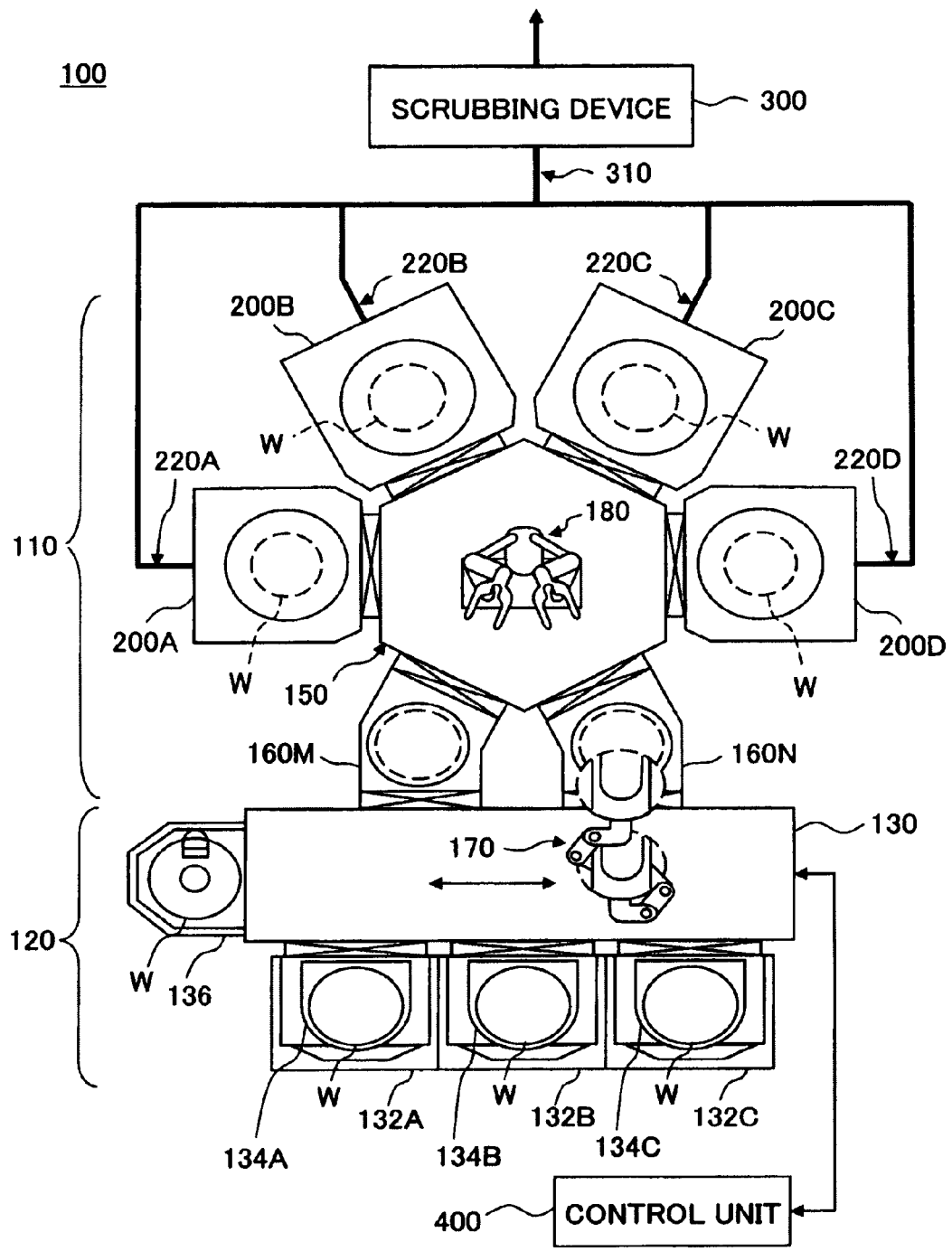
FIG. 1 is a sectional view showing the structure adopted in a substrate processing apparatus achieved in an embodiment of the present invention.

The following is a detailed explanation of preferred embodiments of the present invention, given in reference to the attached drawings. It is to be noted that in the specification and the drawings, the same reference numerals are assigned to components having substantially identical functions and structural features to preclude the necessity for a repeated explanation thereof.

(Structural Example Adopted in Substrate Processing Apparatus)

First, the substrate processing apparatus achieved in an embodiment of the present invention is explained in reference to drawings. FIG. 1 schematically shows the structure adopted in the substrate processing apparatus in an embodiment of the present invention. The substrate processing apparatus 100 comprises a processing unit 110 where various types of processing such as film formation and etching are executed on substrates which may be, for instance, semiconductor wafers (hereafter may be simply referred to as "wafers") W and a transfer unit 120 that transfers the wafers W to/from the processing unit 110.

First, an example of a structure that may be adopted in the transfer unit 120 is explained. As shown in FIG. 1, the transfer unit 120 includes a transfer chamber 130 through which wafers are transferred between substrate storage containers such as cassette containers 132 (132A through 132C) to be detailed later and the processing unit 110. The transfer chamber 130 is formed as a box with a substantially polygonal section. On one side of the transfer chamber 130 along the longer side of its substantially polygonal section, a plurality of cassette stages 131 (131A through 131C) are disposed side-by-side. The cassette containers 132A through 132C representing an example of substrate storage containers can be placed on the cassette stages 131A through 131C respectively.

The cassette containers 132 (132A through 132C) each has a capacity for holding up to, for instance, 25 wafers W stacked with uniform pitches. The cassette containers adopt a sealed structure with their inner space filled with, for instance, an $N_2$ gas atmosphere. The wafers W can be transferred between the transfer chamber 130 and the cassette containers via gate valves. It is to be noted that the numbers of the cassette stages 131 and the cassette containers 132 are not limited to those shown in FIG. 1.

An orienter (pre-alignment stage) 136 to function as a positioning device is disposed at an end of the transfer chamber 130. This orienter 136 aligns a wafer W by detecting an orientation flat, a notch or the like in the wafer W.

Inside the transfer chamber 130, a transfer unit-side transfer mechanism (transfer chamber internal transfer mechanism) 170 that transfers a wafer W along the longer side of the transfer chamber (along the direction indicated by the arrow in FIG. 1) via, for instance, a linear drive mechanism is disposed. The transfer unit-side transfer mechanism 170 is driven based upon a control signal provided by a control unit 400. It is to be noted that the transfer unit-side transfer mechanism 170 may be a double-arm mechanism with two picks such as that shown in FIG. 1, or it may be a single-arm mechanism with a single pick.

Next, an example of a structure that may be adopted in the processing unit 110 is explained. The processing unit 110 in, for instance, a cluster tool-type substrate processing apparatus may include a plurality of processing chambers 200 (first through fourth processing chambers 200A through 200D) where specific types of processing such as film formation (e.g., plasma CVD processing) and etching (e.g., plasma etching) are executed on wafers W and load-lock chambers 160M and 160N, all connected around a common transfer chamber 150 assuming a Polygonal shape (e.g., a hexagonal shape) as shown in FIG. 1 with a high level of airtightness.

Gas supply systems 210A through 210D (not shown in FIG. 1) through which specific types of gases to be used as a processing gas and a purge gas can be supplied into the individual processing chambers 200A through 200D and discharge systems 220A through 220D through which the processing chambers 200A through 200D can be discharged are respectively connected to the processing chambers 200A through 200D. It is to be noted that examples of structures that may be adopted in the gas supply systems and the discharge systems are to be described in detailed later.

The processing chambers 200A through 200D may adopt the internal structure described below. Namely, an upper electrode and a lower electrode are disposed so as to face opposite each other inside each of the processing chambers 200A through 200D. The gas supply system mentioned above is connected to the upper electrode. The lower electrode also functions as a stage on which a wafer W is placed. High frequency power sources that apply high frequency power at specific levels are connected to the upper electrode and the lower electrode.

As a wafer W, for instance, is transferred into each of the processing chambers 200A through 200D and placed on the lower electrode, the processing chamber is set in a state of vacuum with a predetermined pressure level through discharge processing executed via the corresponding discharge system. The high frequency power is applied to the upper electrode and the lower electrode and the processing gas supplied from the gas supply system is evenly directed toward the wafer W via the upper electrode. The processing gas drawn in via the upper electrode is then raised to plasma with which the surface of the wafer W is, for instance, etched.

Wafers W are processed in the individual processing chambers 200A through 200D based upon wafer processing information such as process recipes indicating specific processing steps and the like, which is stored in advance at a storage means or the like in, for instance, the control unit 400. The contents of the wafer processing information vary depending upon the types of the wafer processing and the conditions under which the wafer processing is to be executed. It is to be noted that the number of processing chambers 200 may be different from that shown in FIG. 1.

The common transfer chamber 150 has a function of transferring wafers W between the individual processing chambers 200A through 200D described above and/or between the processing chambers 200A through 200D and the first and second load-lock chambers 160M and 160N. The common transfer chamber 150 assumes a polygonal shape (e.g., a hexagonal shape). The processing chambers 200 (200A through 200D), which are disposed around the common transfer chamber, are each connected with the common transfer chamber via a gate valve and the front ends of the first and second load-lock chambers 160M and 160N are each connected with the common transfer chamber via a gate valve (a vacuum pressure-side gate valve). The base ends of the first and second load-lock chambers 160M and 160N are connected to the other side surface of the transfer chamber 130 each via a gate valve (an atmospheric pressure-side gate valve).

The first and second load-lock chambers 160M and 160N have a function of temporarily holding wafers W and passing them on to subsequent stages after pressure adjustment. Inside each of the first and second load-lock chambers 160M and 160N, a transfer stage on which a wafer can be placed is disposed.

At the processing unit 110 structured as described above, the passages between the common transfer chamber 150 and the individual processing chambers 200A through 200D and the passages between the common transfer chamber 150 and the individual load-lock chambers 160M and 160N can be opened/closed while assuring a high level of airtightness, thereby achieving a cluster-tool structure that allows communication with the common transfer chamber 150 as necessary. In addition, the passages between the transfer chamber 130 and the first and second load-lock chambers 160M and 160N, too, can be opened/closed while assuring airtightness.

Inside the common transfer chamber 150, a processing unit-side transfer mechanism (common transfer chamber internal transfer mechanism) 180 constituted with articulated arms capable of flexing, moving up/down and rotating, for instance, is disposed. This processing unit-side transfer mechanism is used to transfer wafers W from the load-lock chambers 160M and 160N to the individual processing chambers 200A through 200D and vice versa. The processing unit-side transfer mechanism 180 is driven based upon a control signal provided by the control unit 400. It is to be noted that the processing unit-side transfer mechanism 180 may be a double-arm mechanism with two picks such as that shown in FIG. 1, or it may be a single-arm mechanism with a single pick.

The substrate processing apparatus 100 includes the control unit 400 that controls the overall operations of the substrate processing apparatus including control of the transfer unit-side transfer mechanism 170, the processing unit-side transfer mechanism 180, the various gate valves and the orienter 136. An example of a structure that may be adopted in such a control unit 400 is explained later.

The substrate processing apparatus 100 also includes a common scrubbing device 300 that scrubs (eliminates noxious elements in) gases discharged from the various processing chambers 200A through 200D. The scrubbing device 300 is connected to a common discharge system 310 connected with the discharge systems 220A through 220D respectively provided in conjunction with the processing chambers 200A through 200D. The common discharge system 310 is connected via the scrubbing device 300 to a discharge system at, for instance, a plant where the substrate processing apparatus 100 is installed.

As the substrate processing apparatus 100 structured as described above is engaged in operation, processing on wafers W starts. For instance, a wafer W taken out of one of the cassette containers 132A through 132C by the transfer unit-side transfer mechanism 170 is then carried over to the orienter 136. After undergoing alignment at the orienter 136, the wafer W is carried out of the orienter 136 and is moved into either the load-lock chamber 160M or the load-lock chamber 160N. If a processed wafer W having undergone all the required processing is present in the load-lock chamber 160M or 160N at this time, the unprocessed wafer W is carried into the load-lock chamber after carrying out the processed wafer W.

The wafer having been carried into the load-lock chamber 160M or 160N is transferred out of the load-lock chamber 160M or 160N by the processing unit-side transfer mechanism 180, and is transferred into the processing chamber 200 where it is to undergo the specific type of processing. Once the processing is completed in the processing chamber 200, the processed wafer is transferred out of the processing chamber 200 by the processing unit-side transfer mechanism 180. If the wafer W needs to undergo continuous processing at a plurality of processing chambers 200, the wafer is carried into another processing chamber 200 to undergo the next phase of processing.

Ultimately, the processed wafer having undergone all the required processing is carried back into the load-lock chamber 160M or 160N. The processed wafer W having been moved back into the load-lock chamber 160M or 160N is then taken back into the initial cassette container among the cassette containers 132A through 132C by the transfer unit-side transfer mechanism 170.

The discharge gases discharged via the discharge systems 220A through 220D of the processing chambers 200A through 200D while the substrate processing apparatus 100 is engaged in operation are then directed from the common discharge system 310 to, for instance, the plant exhaust system via the scrubbing device 300.

Figure 2:
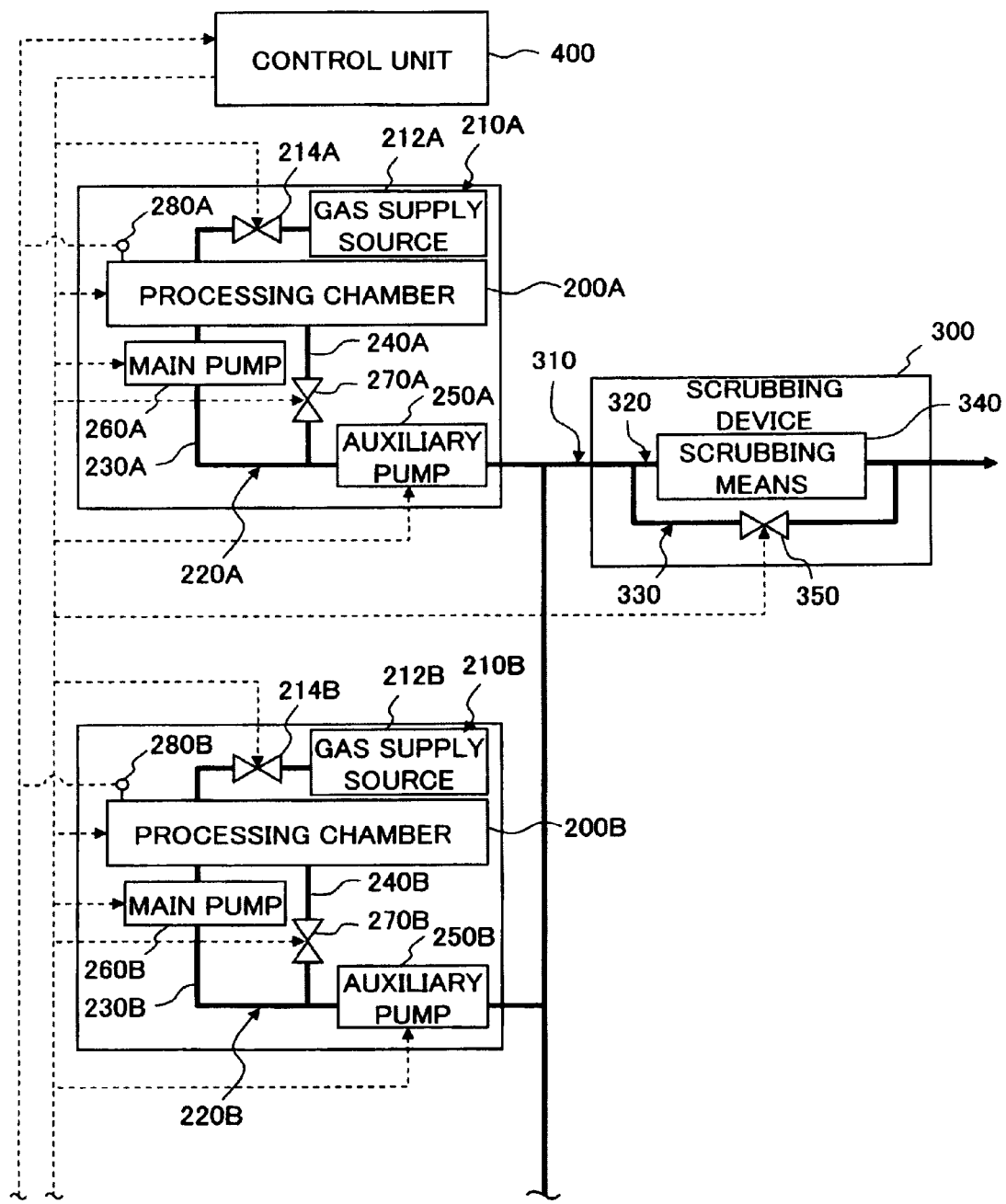
FIG. 2 is a block diagram presenting a piping structure example that may be adopted in the individual processing chambers and an example of a structure that may be adopted in the scrubbing device at the substrate processing apparatus shown in FIG. 1.

Now, an example of a piping structure that may be adopted in the individual processing chambers 200A through 200D and an example of a structure that may be adopted in the scrubbing device 300 are explained in reference to a drawing. FIG. 2 is a block diagram showing an example of a piping structure that may be adopted in the individual processing chambers 200A through 200D and an example of a structure that may be adopted in the scrubbing device 300. Since the piping structures at the processing chambers 200A through 200D are identical, an explanation is given below on a processing chamber 200 representing the individual processing chambers 200A through 200D. This means that the processing chamber 200 may be any of the processing chambers 200A through 200D.

(Example of Piping Structure in Processing Chamber)

First, the piping structure (which includes the gas supply system and the discharge system) adopted at the processing chamber 200 is explained. As shown in FIG. 2, a pressure sensor 280 that detects a pressure inside the processing chamber 200, a gas supply system 210 through which a specific type of gas to be used a processing gas or a purge gas can be supplied into the processing chamber 200 and a discharge system 220 through which the processing chamber 200 can be discharged are disposed in conjunction with the processing chamber 200.

The gas supply system 210 may be constituted by, for instance, connecting a gas supply source 212 to the processing chamber 200 via a gas supply valve 214. The gas drawn into the processing chamber 200 from the gas supply source 212 may be a processing gas requiring scrubbing upon discharge from the processing chamber, such as a PFC gas ($CF_4$, $C_2F_6$ or the like) which hastens the process of global warming, or $NF_3$, $SF_6$, $NH_3$, $NO_X$, hydrogen halide or a heavy-metal alkoxide complex containing hazardous components. Or the gas drawn into the processing chamber 200 may be an inert gas used as a purge gas or a pressure adjusting gas. The term "inert gas" is used in the description to broadly refer to a gas that does not induce a chemical change readily and, such an inert gas may be $N_2$ gas, as well as any of the rare gas elements such as Ar and He. It is to be noted that the gas supply system 210 may adopt a structure other than that shown in FIG. 2. For instance, a flow regulating means such as a mass flow controller or a check valve may be disposed downstream of the gas supply valve.

The discharge system 220 may be constituted by, for instance, connecting in parallel a main discharge system 230 and an auxiliary discharge system 240 to the processing chamber 200. The main discharge system 230 and the auxiliary discharge system 240 join each other on the discharge side and are together connected to an auxiliary pump 250. A main pump 260 is connected to the main discharge system 230, whereas a switch-over valve (switching valve, auxiliary valve) 270 used to switch between discharge through the main discharge system 230 and discharge through the auxiliary discharge system 240 is connected to the auxiliary discharge system 240. It is to be noted that the main pump 260 connected to the main discharge system 230 is connected with the processing chamber 200 via a pressure adjusting valve (APC) (not shown).

The auxiliary pump 250 may be a dry pump with which roughing vacuum processing is executed to evacuate the processing chamber 200 to a state of vacuum achieving a specific pressure. The main pump 260 may be, for instance, a turbo-pump with which main discharge processing is executed to further evacuate the processing chamber 200 until a desired vacuum is achieved. The discharge side of the auxiliary pump 250 in the discharge system 220 is connected to the scrubbing device 300 via the common discharge system 310. It is to be noted that as long as roughing vacuum processing, at least, can be executed with the discharge system 220, the discharge system 220 may adopt a structure other than that shown in FIG. 2.

The pressure sensor 280 is constituted with, for instance, a diaphragm gauge (e.g., a capacitance manometer). An output from the pressure sensor 280 is provided to the control unit 400 of the substrate processing apparatus 100. In addition, the gas supply valve 214 in the gas supply system 210 and the switch-over valve 270 in the discharge system 220 are controlled based upon control signals provided by the control unit 400.

(Examples of Operations at Gas Supply System and Discharge System)

Before processing a wafer W in the processing chamber 200 structured as described above, discharge processing is first executed with the gate valve at the processing chamber 200 kept in a closed state so as to reduce the pressure inside the processing chamber 200 to a predetermined level. During the discharge processing, the pressure inside the processing chamber is first lowered to a specific level through the roughing vacuum processing and then the pressure at the specific level may be further lowered to a level having been set to achieve a high level of vacuum through main discharge processing.

More specifically, the roughing vacuum processing is first executed by opening the switch-over valve 270 so as to switch the discharge system 220 to the auxiliary discharge system

240 and driving the auxiliary pump 250. Then, once the pressure inside the processing chamber detected by the pressure sensor 280 is lowered to the specific level, the switch-over valve 270 is closed to switch the discharge system 220 to the main discharge system 230 and the main discharge processing is executed by driving the main pump 260 until the pressure detected by the pressure sensor 280 is lowered to the preset level.

Once the main discharge processing is completed, the gate valve is opened and the wafer W is carried into the processing chamber 200. After the wafer W is placed on the stage, the gate valve is closed and the operation shifts to processing the wafer W. At this time, the processing gas from the gas supply source 212 is drawn into the processing chamber 200 by opening the gas supply valve 214 while the switch-over valve 270 is in a closed state and the main discharge system 230 is selected at the discharge system 220, and thus, the processing of the wafer W starts. Namely, the wafer W is processed over a predetermined length of time while the pressure inside the processing chamber 200 is sustained at the predetermined level by monitoring the pressure detected by the pressure sensor 280.

Once the wafer W is processed, the gas supply valve 214 is closed, carryover discharge of the processing chamber 200 is executed via the main discharge system 230 and the processed wafer W is carried out of the processing chamber 200. The processing of the particular wafer W thus ends. Subsequently, a next wafer W is carried into the processing chamber 200. Namely, wafers W are sequentially processed one at a time through the procedure described above. The discharge gas discharged through the discharge system 220 of the processing chamber 200 as wafers W are processed as described above is directed to, for instance, the factory discharge system from the common discharge system 310 via the scrubbing device 300.

(Example of Structure that May be Adopted in Scrubbing Device)

Next, an example of a structure that may be adopted in the scrubbing device is explained. The scrubbing device 300 is connected with the common discharge system 310. More specifically, the common discharge system 310 branches into a scrubbing common discharge system 320, through which the discharge gas from the processing chamber 200 is first scrubbed in the scrubbing device 300 and is then discharged and a non-scrubbing common discharge system 330, through which the discharge gas from the processing chamber 200 is directly discharged without undergoing scrubbing.

A scrubbing means 340 for scrubbing the discharge gas from the common discharge system 310 is connected to the scrubbing common discharge system 320, whereas a switch-over valve (switching valve) 350 that effects a switch-over between discharge through the scrubbing common discharge system 320 and discharge through the non-scrubbing common discharge system 330 is connected to the non-scrubbing common discharge system 330. The discharge sides of the scrubbing common discharge system 320 and the non-scrubbing common discharge system 330 join each other and are then together connected to the plant exhaust system.

It is to be noted that the scrubbing means 340 may be constituted with, for instance, a scrubbing reactor tank where the discharge gas passing through the scrubbing common discharge system 320 is scrubbed through a heat treatment. It is to be noted that the scrubbing means may scrub the discharge gas through any of various types of processing other than a heat treatment. The switch-over valve 350 of the scrubbing device is controlled based upon a control signal provided via the control unit 400. The control unit 400 executes switch-over control for the switch-over valve 350 of the scrubbing device 300 in correspondence to the type of processing executed in the processing chamber 200.

(Example of Operations Executed at Scrubbing Device)

Figure 3:
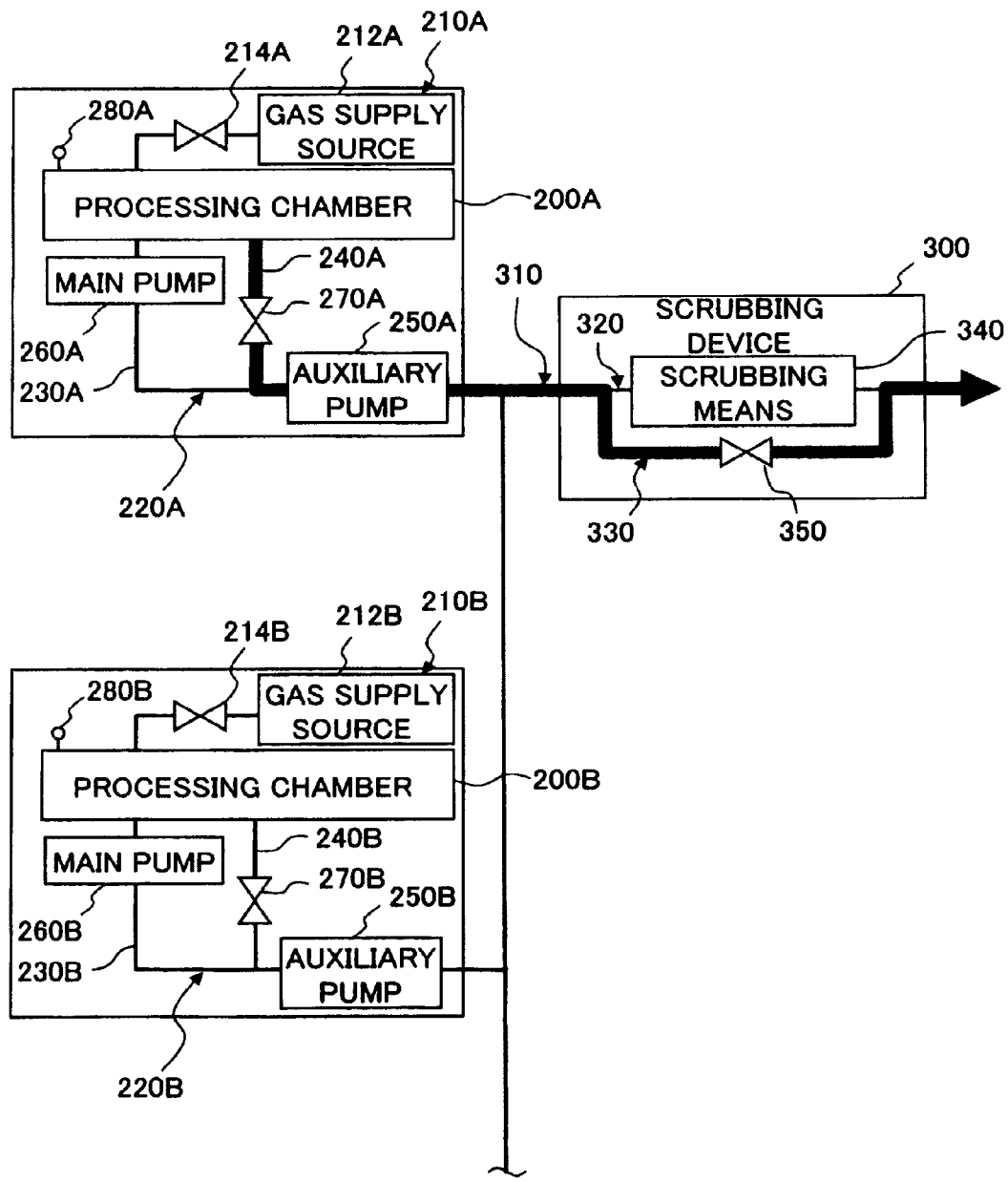
FIG. 3 illustrates a flow of discharge gas that may be observed when the discharge gas from a single processing chamber engaging the scrubbing device is discharged via the non-scrubbing common discharge system.
Figure 4:
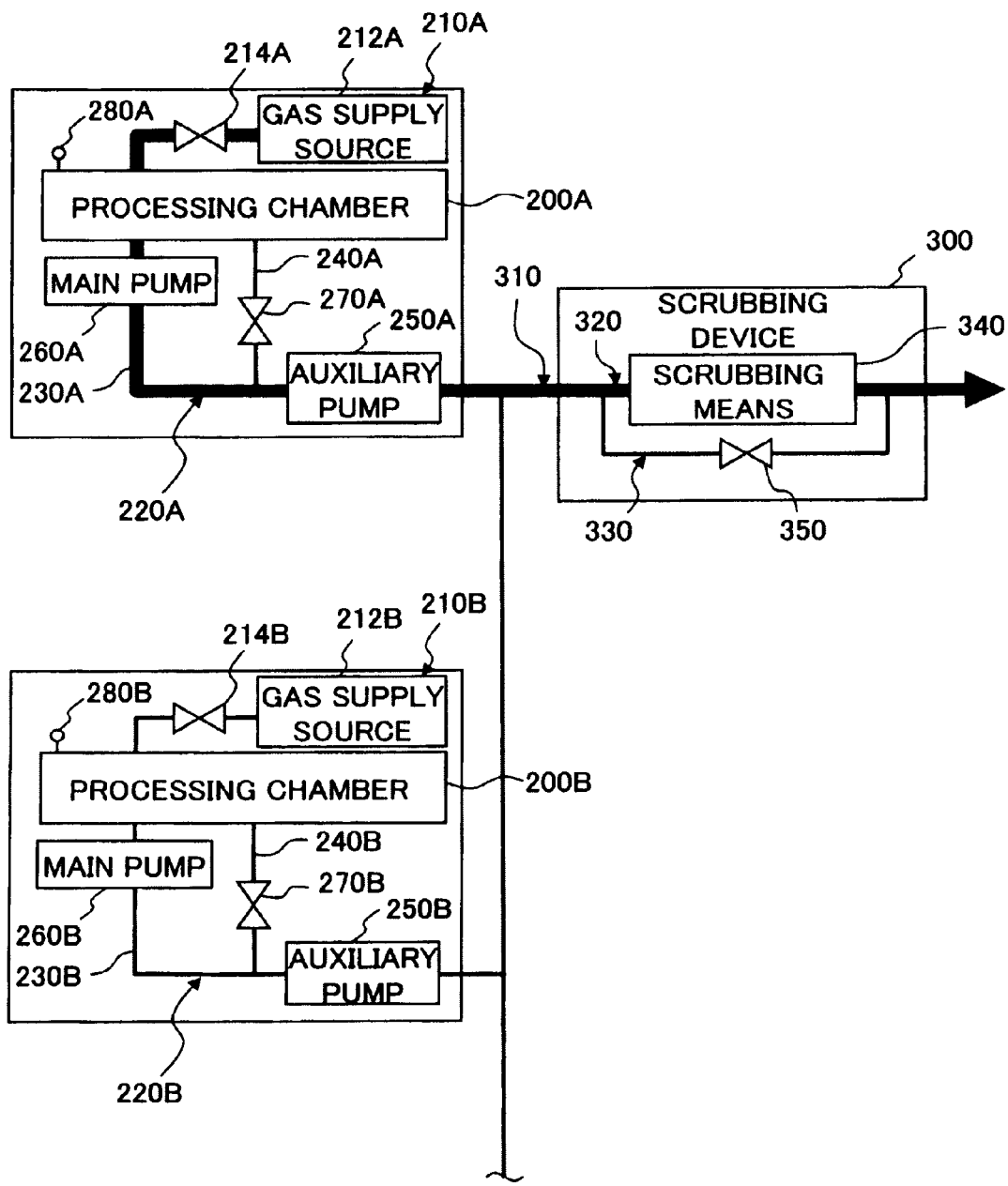
FIG. 4 illustrates a flow of discharge gas that may be observed when the discharge gas from a single processing chamber engaging the scrubbing device is discharged via the scrubbing common discharge system.

Next, an example of operations that may be executed at the scrubbing device structured as described above is explained in reference to drawings. First, operations that may be executed when the discharge gas from a single processing chamber is discharged via the scrubbing device 300 are explained. In the example explained below, the scrubbing device 300 is engaged in operation to discharge gas from the processing chamber 200A among the processing chambers 200A through 200D. FIGS. 3 and 4 illustrate flows of the discharge gas (indicated by the bold arrows) that may be observed when the gas in the processing chamber 200A alone is discharged via the scrubbing device 300.

As explained earlier, the switch-over between discharge via the scrubbing common discharge system 320 and discharge via the non-scrubbing common discharge system 330 is effected depending upon the type of processing executed in the processing chamber 200A via a the switch-over valve 350 at the scrubbing device 300. Thus, when executing roughing vacuum processing inside the processing chamber 200A as described above, the switch-over valve 350 of the scrubbing device 300 is set in an open state to switch to discharge via the non-scrubbing common discharge system 330, as shown in FIG. 3, to directly discharge the gas without first scrubbing it. When executing other processing, e.g., when processing a wafer W by drawing in the processing gas, on the other hand, the switch-over valve 350 at the scrubbing device 300 is set in a closed state to switch over to discharge via the scrubbing common discharge system 320, as shown in FIG. 4 to discharge the gas after scrubbing it.

Under normal circumstances, when the roughing vacuum processing is executed before processing the wafer W, no processing gas is drawn into the processing chamber yet and thus, no discharge gas containing a harmful substance is discharged from the processing chamber 200A. For this reason, the gas in the processing chamber 200A may be discharged without it first being scrubbed at the scrubbing means 340. In addition, a discharge executed to lower a relatively high pressure, such as roughing vacuum processing executed to lower the atmospheric pressure will place a significant onus on the scrubbing device 300 if the gas discharged through the processing is to the discharged via the scrubbing means 340 of the scrubbing device 300. However, the gas discharged through such processing, does not need to be scrubbed at the scrubbing means 340. By directing the discharge gas to be directly discharged without scrubbing, the onus placed on the scrubbing device 300 can be reduced to extend the service life of the scrubbing device 300. Furthermore, since higher efficiency is achieved in the scrubbing processing, the amount of energy used in the scrubbing processing, too, is reduced, which allows a scrubbing device with a small capacity to fully function as a common scrubbing device 300 to serve the individual processing chambers.

The types of processing that may be executed in the processing chamber 200A include, for instance, maintenance processing executed by an operator and automatic inspection processing (auto-check processing) automatically executed to inspect the various units of the substrate processing apparatus 100 to improve the efficiency of regular maintenance work and reduce the length of time required for regular maintenance work, in addition to the regular processing executed on wafers W as described above. The automatic inspection processing (auto-check processing) includes auto setup processing and self check processing, and various check items inspected during the processing include the gas supply system 210A and the discharge system 220A of the processing chamber 200A. Accordingly, roughing vacuum processing also needs to be executed in the processing chamber 200, as described above, for the maintenance processing or the auto-check processing.

In particular, when the auto-check processing is underway in the processing chamber 200A, roughing vacuum processing may be executed after drawing the processing gas into the processing chamber through buildup processing during which the pressure inside the processing chamber is raised to a predetermined level by drawing in the processing gas from, for instance, the gas supply system 210A and monitoring the pressure in the processing chamber with the pressure sensor 280A. Under such circumstances, the processing gas is discharged through the roughing vacuum processing, and if the processing gas contains a harmful substance, it needs to be first scrubbed before it is discharged. In other words, discharge gas containing a harmful substance is discharged when a specific type of roughing vacuum processing is executed at the processing chamber 200A.

If such roughing vacuum processing is executed with the switch-over valve 350 at the scrubbing device 300 automatically switched to discharge via the non-scrubbing common discharge system 330 by interlocking with the switch-over valve 270A, which is opened to switch to the auxiliary discharge system 240A, a discharge gas containing harmful substances may be directly discharged to the plant exhaust system without first being scrubbed.

Accordingly, instead of interlocking with the switch-over valve 270A, the switch-over valve 350 is controlled, as described below, by the control unit 400 of the substrate processing apparatus 100. Namely, a decision is made at the control unit 400 as to whether or not the processing to be executed at the processing chamber 200A is executed initially under high pressure conditions (e.g., a pressure equal to or higher than a predetermined level) that does not require, at least, discharge gas scrubbing. If it is decided that such processing is to be executed at the processing chamber 200A, the common discharge system 310 is switched to the non-scrubbing common discharge system 330 by opening the switch-over valve 350 of the scrubbing device 300, as shown in FIG. 3, to discharge the gas without first scrubbing it. If, on the other hand, it is decided that the processing is not executed initially under high pressure conditions (e.g., a pressure equal to or higher than a predetermined level), the common discharge system 310 is switched to the scrubbing common discharge system 320 by closing the switch-over valve 350 of the scrubbing device 300, as shown in FIG. 4, to first scrub the gas and then discharge it.

The decision as to whether or not the processing is executed initially under high pressure conditions (e.g., a pressure equal to or higher than the predetermined level) may be made during this operation by, for instance, detecting the pressure inside the processing chamber 200A with a pressure sensor 280A when executing the processing in the processing chamber 200A, judging that the processing is initially executed in a high pressure condition if the detected pressure is equal to or higher than a predetermined level (e.g., 50 Torr (66.6 hPa)) and judging that the processing is executed initially under low pressure conditions from the beginning if the detected pressure is lower than the predetermined level (e.g., 50 Torr).

Under this control, the gas discharged through roughing vacuum processing in the processing chamber 200 at a pressure of, for instance, one atmosphere, i.e., processing executed initially under high pressure conditions, which does not require discharge gas scrubbing, is discharged via the non-scrubbing common discharge system 330 without undergoing the process of scrubbing.

In contrast, the gas discharged during maintenance processing or auto-check processing executed under low pressure conditions needs to be first scrubbed via the scrubbing common discharge system 320 and then discharged, even when the gas is discharged through roughing vacuum processing. In addition, wafer processing that requires the processing gas to be drawn into the processing chamber is executed under low pressure conditions and necessitates scrubbing of the discharge gas. Accordingly, the discharge gas resulting from such processing, too, is first scrubbed and then discharged via the scrubbing common discharge system 320.

The scrubbing device 300 operating as described above prevents discharge of any discharge gas containing a harmful substance to the plant exhaust system with a high level of reliability. Moreover, even if the gas resulting from the roughing vacuum processing or the wafer processing executed initially under low pressure conditions is discharged via the scrubbing means 340, the onus placed on the scrubbing device 300 on account of such roughing vacuum processing or wafer processing is not as significant as the onus placed on the scrubbing device 300 on account of roughing vacuum processing executed initially under high pressure conditions.

Next, an example of operations that may be executed at the scrubbing device when processing is concurrently executed at a plurality of processing chambers is explained in reference to drawings. In the example explained below, processing is concurrently executed at the processing chambers 200A and 200B among the processing chambers 200A through 200D. FIGS. 5 through 8 illustrate flows of the discharge gas (indicated by the bold arrows) that may be observed when processing is executed concurrently at the processing chambers 200A and 200B.

As explained earlier, if the processing at the processing chambers 200A and 200B does not, at least, require discharge gas scrubbing and is executed initially under high pressure conditions (e.g., a pressure equal to or higher than a predetermined level), the common discharge system 310 is switched to the non-scrubbing common discharge system 330, but otherwise, the common discharge system 310 is switched to the scrubbing common discharge system 320, according to the present invention.

When processing is executed concurrently at a plurality of processing chambers, first processing requiring the common discharge system 310 to be switched to the non-scrubbing common discharge system 330 and second processing requiring the common discharge system 310 to be switched to the scrubbing common discharge system 320 may be simultaneously executed at different processing chambers, depending upon the timing with which the processing at the individual processing chambers is executed. Under such circumstances, if the first processing starts in a processing chamber while the second processing is already in progress in another processing chamber, i.e., while discharge via the scrubbing common discharge system 320 is underway, the discharge will be switched to discharge via the non-scrubbing common discharge system 330. As a result, the other processing chamber where the processing that requires discharge gas scrubbing will be discharged via the non-scrubbing common discharge system 330 allowing toxic discharge gas to be discharged to the plant exhaust system.

Figure 5:
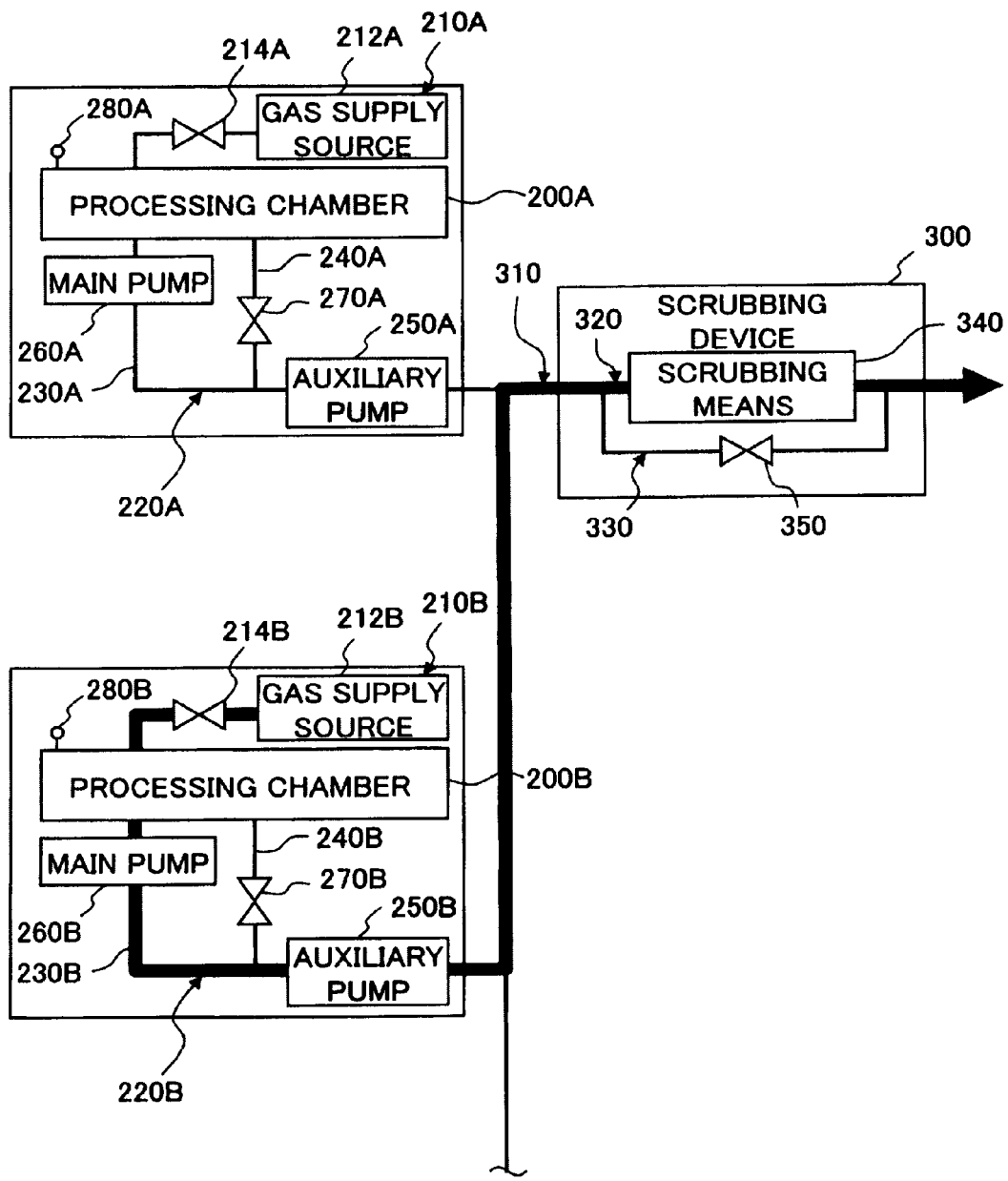
FIG. 5 illustrates a flow of discharge gas that may be observed when processing is concurrently executed at two processing chambers.
Figure 6:
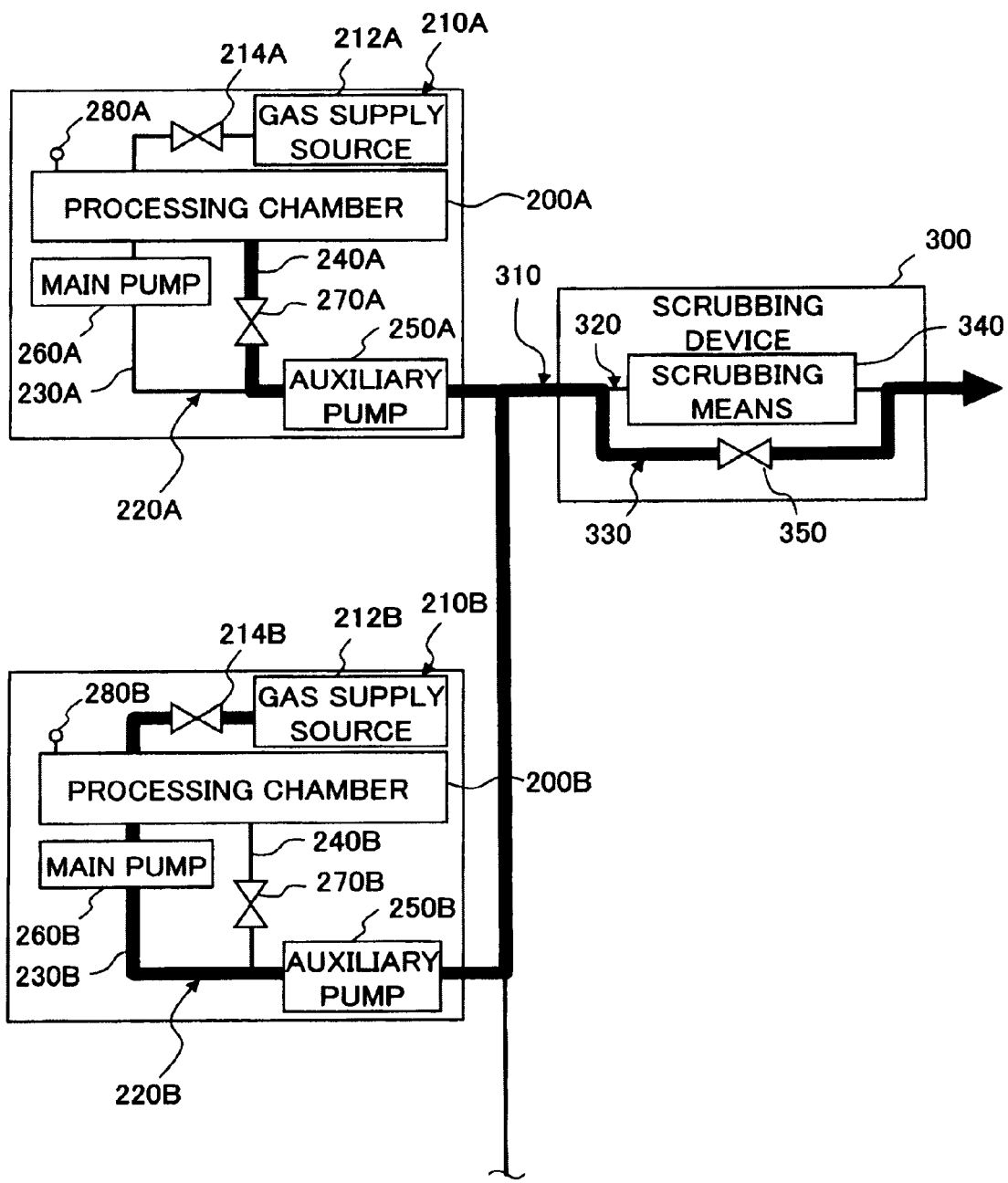
FIG. 6 illustrates a flow of discharge gas that may be observed when processing is concurrently executed at two processing chambers.

For instance, if the first processing, e.g., roughing vacuum processing for lowering the pressure from one atmosphere is executed at the processing chamber 200A, as shown in FIG. 6 while the second processing, e.g., processing of a wafer W executed by drawing in processing gas from the gas supply system 210B, is underway at the other processing chamber 200B with the scrubbing common discharge system 320 engaged in discharge operation, as shown in FIG. 5, the switch-over valve 350 at the scrubbing device 300 is opened to switch over to discharge via the non-scrubbing common discharge system 330. As a result, the discharge gas that needs to be scrubbed, discharged from the processing chamber 200A is directly discharged to the plant exhaust system via the non-scrubbing common discharge system 330 without first undergoing the process of scrubbing, as shown in FIG. 6.

Figure 7:
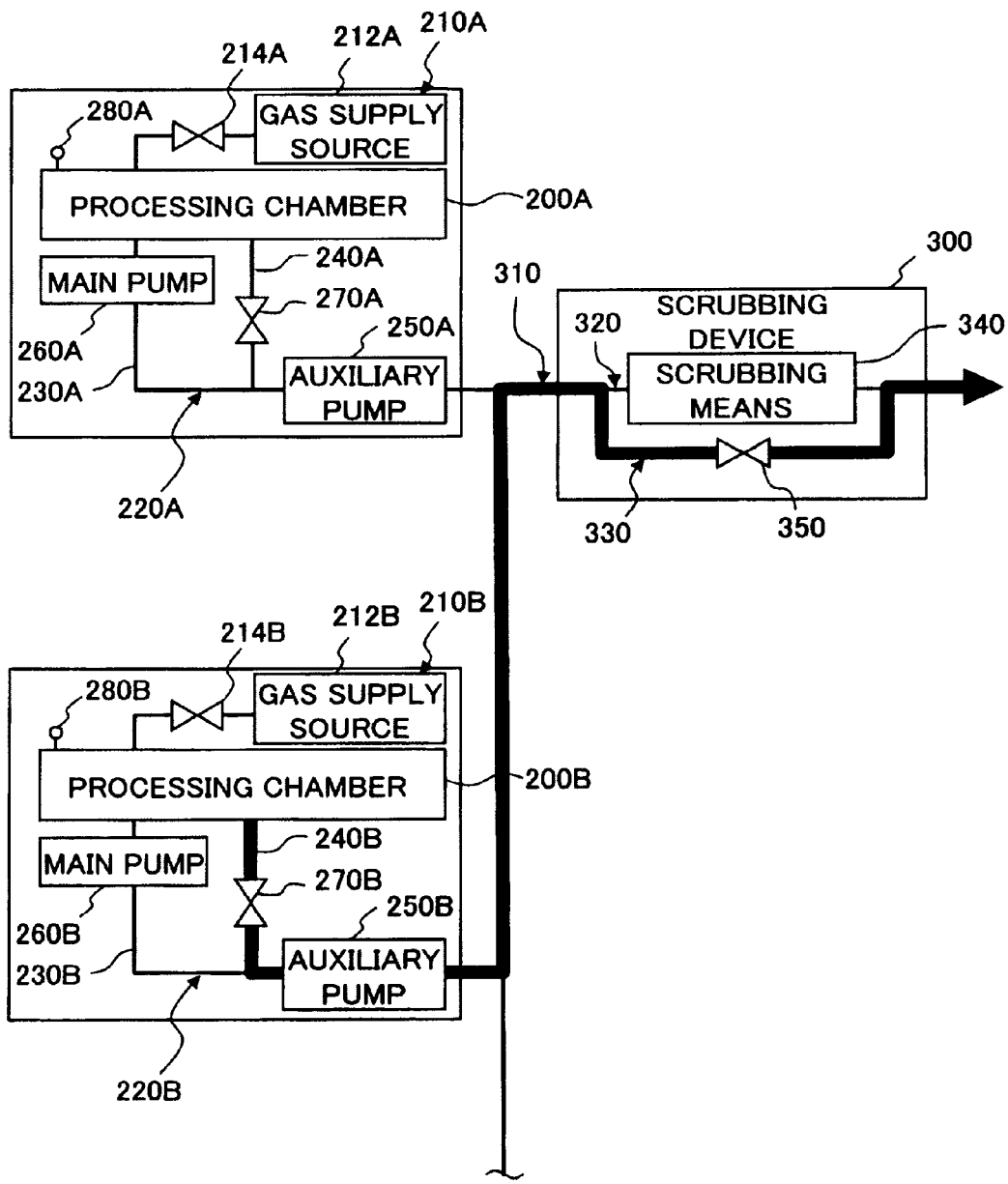
FIG. 7 illustrates a flow of discharge gas that may be observed when processing is concurrently executed at two processing chambers.
Figure 8:
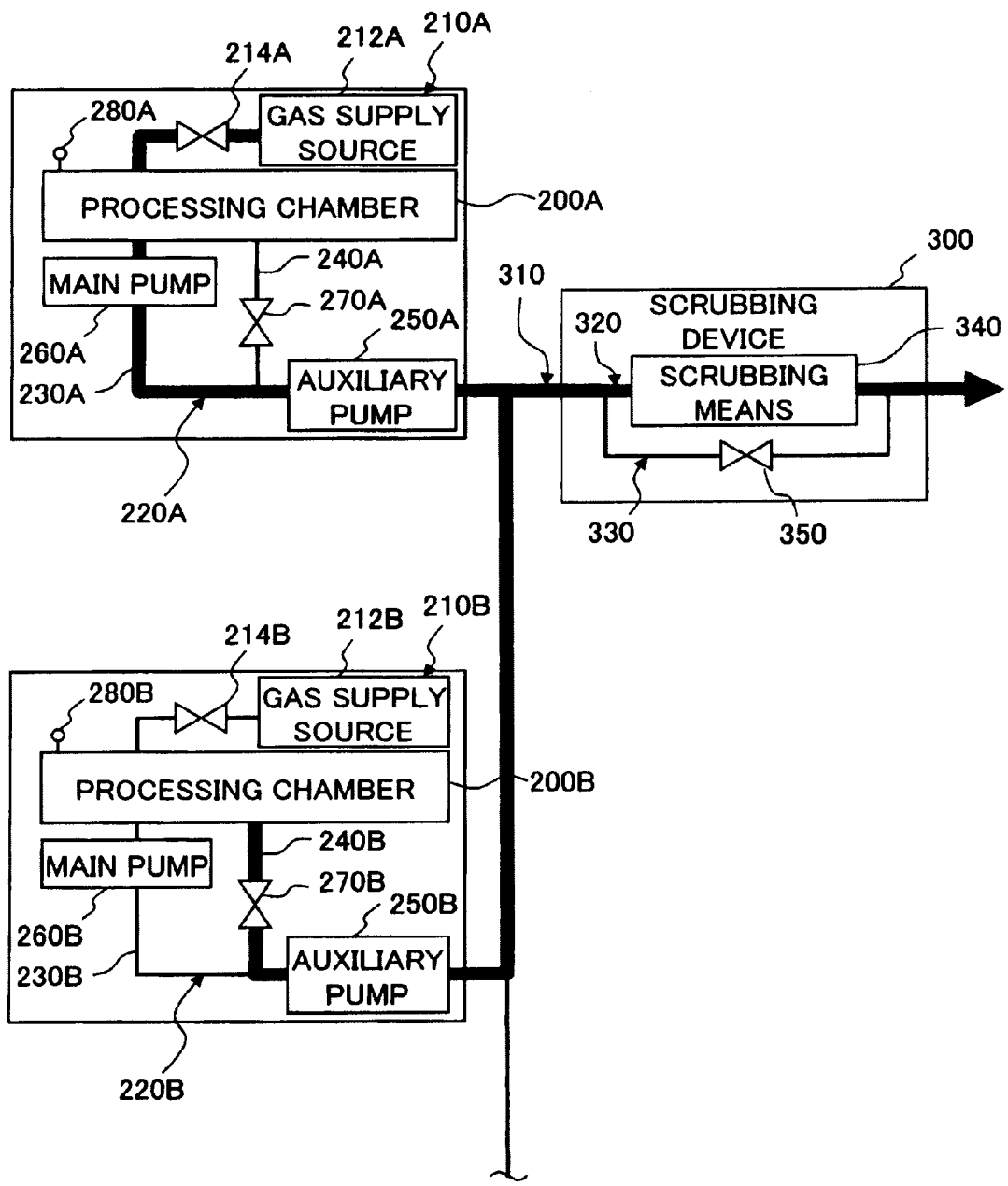
FIG. 8 illustrates a flow of discharge gas that may be observed when processing is concurrently executed at two processing chambers.

If, on the other hand, second processing, e.g., wafer processing executed by drawing in the processing gas from, for instance, the gas supply system 210B, is executed at the processing chamber 200A, as shown in FIG. 8 while the first processing, e.g., roughing vacuum processing executed to lower the pressure from one atmosphere, is underway at the processing chamber 200B by engaging the non-scrubbing common discharge system 330 in discharge operation as shown in FIG. 7, the switch-over valve 350 at the scrubbing device 300 is closed to switch over to discharge via the scrubbing common discharge system 320. In this case, while the problem of discharge gas that needs to be scrubbed, discharged from the processing chamber 200A, being directly discharged to the plant exhaust system via the non-scrubbing common discharge system 330 without first being scrubbed does not occur, the gas from the processing chamber 200B where the processing is executed initially under high pressure conditions is discharged unnecessarily via the scrubbing means 340 through the scrubbing common discharge system 320, thereby increasing the onus placed on the scrubbing device 300.

According to the present invention, this problem is addressed by executing a specific type of exclusivity control under which processing is concurrently executed at a plurality of processing chambers by ensuring that when either the first processing or the second processing is currently in progress in a given processing chamber, the other processing is not executed in any of the remaining processing chambers. By executing this exclusivity control, synchronous execution of processing that does not require discharge gas scrubbing and processing that does require discharge gas scrubbing at different processing chambers are prevented even when processing is executed concurrently at a plurality of processing chambers. As a result, the onus on the scrubbing device 300 is reduced and, at the same time, any discharge gas requiring scrubbing is not allowed to be directly discharged to the plant exhaust system without first undergoing the process of scrubbing.

(Example of Structure Adopted in Control Unit that Executes Exclusivity Control)

Next, the control unit that executes the exclusivity control described above is explained. Since such exclusivity control may be executed at, for instance, the control unit 400 that controls the substrate processing apparatus 100, a specific example of a structure that may be adopted in the control unit 400 is explained below in reference to FIG. 9.

Figure 9:
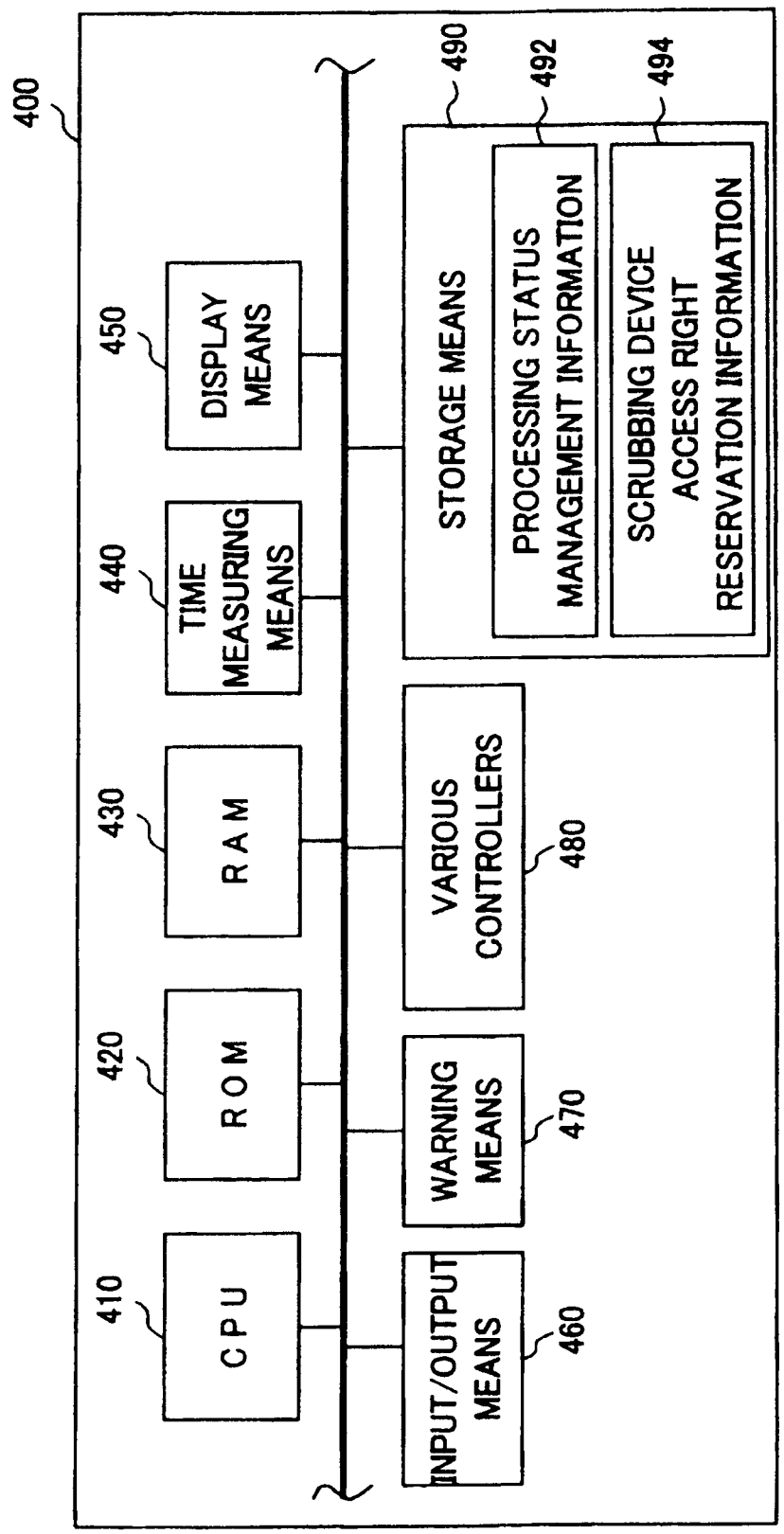
FIG. 9 is a block diagram presenting an example of a structure that may be adopted in the control unit in the embodiment.

The control unit 400 comprises a CPU (central processing unit) 410 constituting the control unit main body, a ROM (read only memory) 420 having stored therein program data (e.g., program data used to execute processing on wafers W, various types of check processing executed in the substrate processing apparatus as described later, scrubbing device access right processing, particle reduction processing and the like) based upon which the CPU 410 controls the various units and the like, a RAM (random access memory) 430 that includes a memory area used by the CPU 410 when it executes various types of data processing, a time measuring means 440 constituted with a counter or the like used to measure lengths of time, a display means 450 constituted with a liquid crystal display or the like at which an operation screen or a selection screen is brought up on display, an input/output means 460 that allows an operator to input/output various types of data, a warning means 470 constituted with, for instance, an alarm such as a buzzer, various controllers 480 used to control the various units constituting the substrate processing apparatus 100 and a storage means 490 constituted with, for instance, a memory, as shown in FIG. 9.

The CPU 410, the ROM 420, the RAM 430, the time measuring means 440, the display means 450, the input/output means 460, the warning means 470, the various controllers 480 and the storage means 490 are electrically connected via a bus line such as a control bus, a system bus or a data bus.

The various controllers 480 include a controller that controls the various units constituting the individual processing chambers 200A through 200D and a valve controller that controls the gas supply valve 214 at the gas supply system 210, the switch-over valve 270 at the discharge system 220 and the switch-over valve 350 at the scrubbing device, as well as the controller used to control the individual transfer mechanisms 170 and 180 and orienter 136. It is to be noted that the various units constituting the processing chambers 200A through 200D may instead be controlled by control units each provided in conjunction with one of the processing chambers 200A through 200D. In such a case, the control unit 400 should be connected with the individual control units serving the respective processing chambers 200A through 200D so as to control the substrate processing apparatus 100 by exchanging data and signals.

At the storage means 490, processing status management information 492 on the processing status indicating whether or not the first processing or the second processing is in progress at each of the processing chambers 200A through 200D, scrubbing device access right reservation information (common discharge system access right reservation information) 494 reserving an access right to the scrubbing device 300 for execution of the first processing or the second processing and the like are stored.

A specific example of the processing status management information 492 is now explained in reference to FIG. 10. As shown in FIG. 10, the processing status management information 492 is constituted with a data table that includes entries such as "processing chamber", "first processing" and "second processing". The data in the "processing chamber" entry indicate a specific processing chamber among the processing chambers 200A through 200D at the substrate processing apparatus 100. The data in the "first processing" entry and the "second processing" entry respectively indicate whether or not the first processing and the second processing are in progress at each subject processing chamber.

"1" is set (stored) in the "first processing" or the "second processing" entry as the corresponding processing starts at the subject processing chamber among the processing chambers 200A through 200D, and "0" is set (stored) when the processing ends. Accordingly, "0" set in the "first processing (or second processing)" entry indicates that the first processing (or second processing) is not currently executed at the subject processing chamber, whereas "1" set in the "first processing (or second processing)" entry indicates that the first processing (or the second processing) is currently in progress at the subject processing chamber.

In the example presented in FIG. 10, "0" is set both in the "first processing" entry and the "second processing" entry for the processing chambers 200A, 200C and 200D, indicating that neither the first processing nor the second processing is currently in progress at the processing chambers 200A, 200C and 200D. "1" is set in the "first processing" entry and "0" is set in the "second processing" entry for the processing chamber 200B, indicating that while the second processing is not being executed, the first processing is in progress at the processing chamber 200B.

Such processing status management information 492 clearly indicates the processing statuses with regard to the first processing and the second processing at the individual processing chambers 200A through 200D, allowing a decision as to whether or not the first processing and the second processing are currently in progress at the other processing chambers to be made with ease based upon the processing status management information 492 when the first processing or the second processing is to be executed at a given processing chamber.

It is to be noted that instead of storing the processing status management information 492 as a data table such as that shown in FIG. 10, the processing statuses with regard to the first processing and the second processing at the processing chambers 200A through 200D may be indicated by flags $F_{A1}$ through $F_{D1}$ and flags $F_{A2}$ through $F_{D2}$, which may be set to either "0" or "1" as described above.

Next, a specific example of the scrubbing device access right reservation information 494 is explained in reference to FIG. 11. The scrubbing device access right reservation information 494 may be constituted with a data table that includes entries such as "processing chamber" and "processing type", as shown in FIG. 11. The data in the "processing chamber" entry indicate a specific processing chamber among the processing chambers 200A through 200D at the substrate processing apparatus 100. The data in the "processing type" entry indicate the specific type of processing (the first processing or the second processing) executed by reserving an access right to the scrubbing device.

Reservations for the first processing or the second processing made in correspondence to the individual processing chambers 200A through 200D are sequentially stored in the data table constituting the scrubbing device access right reservation information 494. Accordingly, the processing (job) having the reservation is indicated in each line in the data table constituting the scrubbing device access right reservation information 494.

In conjunction with the exclusivity control under which, when either the first processing or the second processing is in progress at a given processing chamber, the execution of the other processing is disallowed at the other chambers, the scrubbing device access right reservation information 494 is used to reserve an access right to the scrubbing device 300 (the common discharge system 310) for subsequent execution of the other processing.

Such access rights to the scrubbing device 300 are granted in the order in which reservations are entered in the scrubbing device access right reservation information 494 on a first come first serve basis. Accordingly, as a given type of processing executed at a given processing chamber ends, the other type of processing (job) at the top of the reservation list in the data table constituting the scrubbing device access right reservation information 494 is executed. As the processing is thus executed, the remaining reservations move up in the reservation list.

In the example presented in FIG. 11, the reservation for the first processing to be executed in the processing chamber 200A is at the top of the reservation list and thus, this processing is executed first. Once the processing having been reserved first is executed, the reservation for the first processing to be executed at the processing chamber 200C, which is second in the reservation list, moves up to the top of the reservation list.

A reservation registered in the scrubbing device access right reservation information 494 can be canceled by the operator by operating the input/output means 460 at the control unit 400. In addition, if the processing at a given processing chamber, having been put on hold through a reservation is interrupted, the reservation registered in the scrubbing device access right reservation information 494, too, is canceled. As a reservation is thus canceled, the remaining reservations sequentially move up in the reservation list.

The processing described above may be executed by adopting a queue table data structure that enables first-in, first-out (FIFO) control in the data table constituting the scrubbing device access right reservation information 494.

(Specific Example of Exclusivity Control of First Processing and Second Processing)

Next, a specific example of the exclusivity control of the first processing and the second processing, executed by the control unit 400 structured as described above, is explained. In the example, the first processing is executed by switching the common discharge system 310 to the non-scrubbing common discharge system 330, and the second processing is executed by switching the common discharge system 310 to the scrubbing common discharge system 320.

Examples of the first processing include roughing vacuum processing executed initially at high-pressure (e.g., a pressure equal to or higher than 50 Torr), auto-check processing and maintenance processing during which such roughing vacuum processing is executed, and cleaning processing through which roughing vacuum processing is executed, e.g., particle reduction processing (NPPC: non-plasma particle cleaning) for cleaning the inside of the processing chamber with a purge gas (or an inert gas) drawn into the processing chamber. Particle reduction processing may be executed by alternately evacuating and charging the chamber so as to the switch between a vacuum and a pressure of one atmosphere while drawing in a purge gas such as $N_2$ gas so as to lift and drive away particles having accumulated in the processing chamber, or by flaking off and removing particles having accumulated in the processing chamber with a gas shock wave (a pressure wave transmitted at a speed exceeding the speed of sound) generated under specific conditions as a purge gas such as $N_2$ gas is drawn into the processing chamber at a high flow rate. Furthermore, when removing particles with a gas shock wave, the processing chamber may be discharged while continuously drawing the purge gas into the processing chamber at a high flow rate (by adopting a piping structure such as that shown in FIG. 14, for instance) as described later, or the processing chamber may be evacuated by drawing the purge gas briefly into the processing chamber at a high flow rate and subsequently, continuously drawing in the purge gas at a low flow rate (by adopting a piping structure such as that shown in FIG. 17).

Examples of the second processing include processing executed on a wafer W such as etching or film formation, open processing for opening the gas supply valve 214 to draw in the processing gas, which constitutes part of cleaning processing executed by drawing in the processing gas (e.g., waferless cleaning processing for cleaning the inside of the processing chamber by drawing the processing gas into the processing chamber where no wafer is present), roughing vacuum processing executed initially under low pressure conditions, and auto-check processing and maintenance processing during which a processing gas must be drawn in or roughing vacuum processing must be executed initially in a low-pressure condition (e.g., a pressure lower than 50 Torr).

(Specific Example of Control Under which First Processing is Executed)

Figure 12:
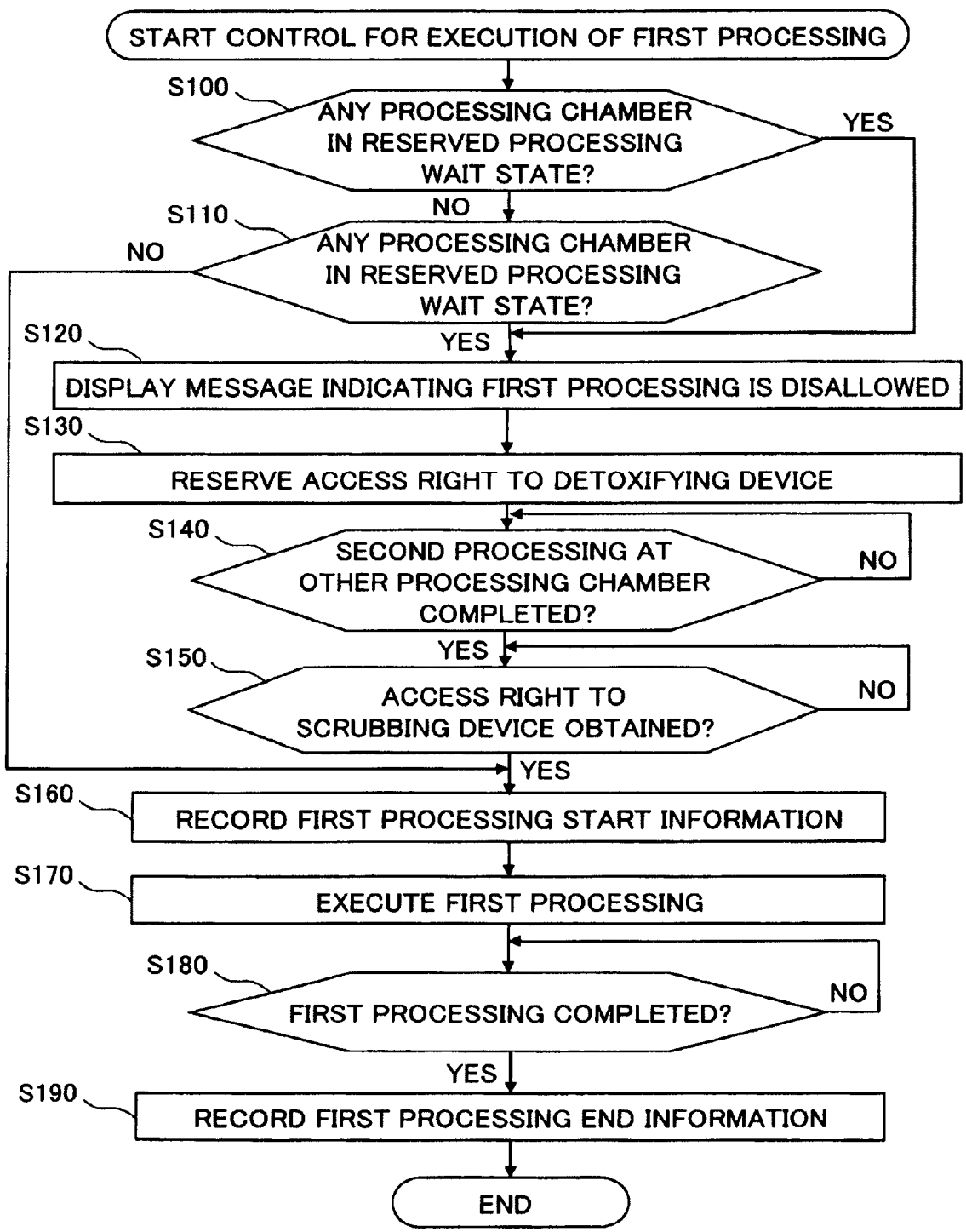
FIG. 12 presents a flowchart of a specific example of control under which the first processing is executed in the embodiment.

First, a specific example of control under which the first processing (e.g., roughing vacuum processing initially executed at high pressure) is executed at a given processing chamber among the processing chambers 200A through 200D is explained. FIG. 12 presents a flowchart of the specific example of the control under which the first processing is executed. As shown in FIG. 12, the execution of the first processing (steps S160 through S190) at a given processing chamber starts after executing the exclusivity control (steps S100 through S150).

During the exclusivity control, a decision is made in step S100 as to whether or not there is a processing chamber waiting in standby to execute reserved processing. More specifically, a decision is made as to whether or not the table constituting the scrubbing device access right reservation information 494 contains any reservation for processing (job). This decision is made so as to confer priority to processing to be executed at another processing chamber, which has been reserved in the table constituting the scrubbing device access right reservation information 494 and awaiting the execution thereof.

If it is decided in step S100 that there is a processing chamber waiting in standby for the execution of reserved processing, i.e., that there is processing (job) for which a reservation has been made in the table constituting the scrubbing device access right reservation information 494, the operation proceeds to step S120 to bring up a display indicating that the first processing cannot be executed at the display means 450, before the operation shifts into reservation processing in step S130 and subsequent steps to be detailed later. As a result, simultaneous execution of the first processing and the second processing at different processing chambers is prevented. It is to be noted that the warning means 490 may be engaged at this time to warn the operator that the first processing cannot be executed.

If, on the other hand, it is decided in step S100 that there is currently no processing chamber waiting for execution of reserved processing, i.e., that there is no processing (job) the execution of which has been reserved in the table constituting the scrubbing device access right reservation information 494, the operation proceeds to step S110 to make a decision as to whether or not the second processing is in progress in another processing chamber. This decision is made so as to prevent simultaneous execution of the first processing and the second processing at different processing chambers. More specifically, the decision is made based upon the processing status management information 492 stored at the storage means 490. For instance, it can be decided that the second processing is not currently being executed at any of the processing chambers 200A through 200D based upon the processing status management information 492 in FIG. 10, which invariably indicates "0" in the "second processing" entries corresponding to the individual processing chambers 200A through 200D.

If it is decided in step S110 that the second processing (e.g., processing on a wafer W) is not currently in progress at another processing chamber, the operation shifts into the processing in step S160 and subsequent steps, thereby starting the first processing. If, on the other hand, it is decided in step S110 that the second processing is currently in progress at another processing chamber, the operation proceeds to step S120 to bring up a display indicating that the first processing cannot the executed at the display means 450. At this time, the warning means 470 may be engaged to warn the operator that the first processing cannot be executed.

Then, the reservation processing is executed in steps S130 through S150. During the reservation processing, an access right to the scrubbing device 300 is first reserved in step S130. More specifically, an access right that will allow the use of the scrubbing device 300 (the common discharge system 310) is reserved at the data table constituting the scrubbing device access right reservation information 494 at the storage means 490.

Next, a decision is made in step S140 as to whether or not the second processing at the other processing chamber has ended. This decision is made based upon the processing status management information 492 at the storage means 490. As the second processing having been in progress at the other processing ends, the "second processing" entry corresponding to the other processing chamber in the processing status management information 492 is switched from "1" to "0" and accordingly, the second processing at the other processing chamber can be judged to have ended when the "second processing" entry is switched to "0". If it is decided in step S140 that the second processing having been in progress at the other processing chamber has not ended yet, the operation waits in standby for the second processing at the other processing chamber to end.

If it is decided in step S140 that the second processing having been in progress at the other processing chamber has ended, the operation proceeds to step S150 to make a decision as to whether or not an access right to the scrubbing device 300 has been obtained. This decision is made in correspondence to the order in which reservations have been registered in the scrubbing device access right reservation information 494. The decision as to whether or not an access right to the scrubbing device 300 has been obtained is made by judging based upon, for instance, the processing status management information 492, as to whether or not the second processing is in progress in another processing chamber. If the second processing is judged to be not in progress at another processing chamber, it is decided that an access right to the scrubbing device 300 has been obtained and, in this case, the operation shifts to the processing in step S160 and subsequent steps, thereby starting the first processing.

If, on the other hand, the second processing is judged to be in progress in another processing chamber, it is decided that an access right to the scrubbing device 300 has not been obtained and the operation waits until an access right to the scrubbing device 300 is obtained. The control follows this flow so as not to execute the first processing if the second processing is underway at yet another processing chamber while the second processing is in progress in a given processing chamber, since the exclusivity control does not apply to concurrent executions of the second processing at different processing chambers. Through this reservation processing, the processing in a processing chamber in a processing wait state can be automatically started.

Next, an explanation is given on how the first processing is started. When starting the first processing, first processing start information is recorded in step S160. More specifically, "1" is set (stored) in the "first processing" entry in the data table constituting the processing status management information 492.

Next, the first processing is executed in step S170. The first processing (e.g., roughing vacuum processing executed initially under high pressure conditions) is executed by opening the switch-over valve 350 of the scrubbing device 300 and thus switching the common discharge system 310 to the non-scrubbing common discharge system 330. The gas discharged from the processing chamber as a result is directly discharged to, for instance, the plant exhaust system without being scrubbing at the scrubbing means 340.

Then, a decision is made in step S180 as to whether or not the first processing has ended. If it is decided in step S180 that the first processing has ended, first processing end information is recorded in step S190. More specifically, "0" is set (stored) in the "first processing" entry in the data table constituting the processing status management information 492. The first processing sequence that includes the exclusivity control with relation to the second processing thus ends.

Under the control achieved in the first embodiment described above, executed in conjunction with the first processing, the first processing (e.g., roughing vacuum processing that does not require scrubbing) is not executed at any of the remaining processing chambers if the second processing (e.g., processing of a wafer W during which gas requiring scrubbing is discharged) is in progress at a given processing chamber. Thus, as long as the second processing is in progress at any processing chamber and the discharge gas is scrubbed at the scrubbing device 300 through the scrubbing common discharge system 320, the scrubbing device 300 is not switched over to non-scrubbing discharge through the non-scrubbing common discharge system 330. As a result, the discharge gas that needs to be scrubbed is never directly discharged without first undergoing the scrubbing process at the scrubbing device 300.

For instance, while the second processing such as processing of a wafer W requiring the discharge gas to be scrubbed is in progress at the processing chamber 200B and the scrubbing discharge is executed via the scrubbing means 340 at the scrubbing device 300 as shown in FIG. 5, the first processing such as roughing vacuum processing executed initially at atmospheric pressure, which does not require discharge gas scrubbing, is not executed at any of the other processing chambers, e.g., the processing chamber 200A. Thus, since the switch-over valve 350 at the scrubbing device 300 is never opened while the second processing is in progress at the processing chamber 200B, as shown in FIG. 6, the discharge gas from the processing chamber 200B is not directly discharged without first undergoing scrubbing at the scrubbing device 300.

In addition, while the second processing such as processing of a wafer W is in progress at a given processing chamber, the first processing such as auto-check processing or maintenance processing that includes roughing vacuum processing executed initially at atmospheric pressure is not executed at the other processing chambers.

In this case, the entire auto-check processing or the entire maintenance processing may be designated as the first processing and the execution thereof may be suspended under the exclusivity control described above, or only the roughing vacuum processing executed initially at atmospheric pressure during the auto-check processing or the maintenance processing may be designated as the first processing and the execution thereof alone may be suspended under the exclusivity control. As long as at least the roughing vacuum processing executed initially at atmospheric pressure is not simultaneously executed at another processing chamber as the second processing, i.e., the processing of a wafer W, is in progress in a given processing chamber, the scrubbing device 300 is not switched to the non-scrubbing common discharge system 330, and thus, the discharge gas that needs to be scrubbed is never directly discharged without first being scrubbed at the scrubbing device 300.

In the latter case, even though the execution of the auto-check processing or the maintenance processing at the other processing chamber can be started while the second processing, i.e., the processing of the wafer W, is in progress in a given processing chamber, the exclusivity control comes into effect at the stage at which the roughing vacuum processing needs to be executed at atmospheric pressure to disable execution of the roughing vacuum processing.

It is to be noted that the exclusivity control does not apply to execution of the first processing (e.g., roughing vacuum processing executed initially at atmospheric pressure) at different processing chambers in the specific example of the first processing procedure that includes the exclusive processing, as shown in FIG. 12. For this reason, the first processing may be executed simultaneously at a plurality of processing chambers. In such a case, the gas discharged from any of the processing chambers where the first processing is in progress does not need to be scrubbed and can be directly discharged without first being scrubbed at the scrubbing means 340 of the scrubbing device 300.

However, when the first processing (e.g., roughing vacuum processing, executed initially at atmospheric pressure) is individually executed at different processing chambers, the pressure levels in the individual processing chambers may not match, depending upon the timing with which the first processing is started in each processing chamber. Under such circumstances, a backflow of the discharge gas from a processing chamber where the pressure is at a higher level to a processing chamber where the pressure is lower may occur. Accordingly, exclusivity control may also be implemented for individual execution of the first processing in different processing chambers. In such a case, the exclusivity control should be executed by substituting the first processing for the second processing in FIG. 12. Under this exclusivity control, simultaneous execution of the first processing at different processing chambers are disallowed and thus, a backflow of the discharge gas into any of the processing chambers can be reliably prevented.

(Specific Example of Control Under Which Second Processing is Executed)

Figure 13:
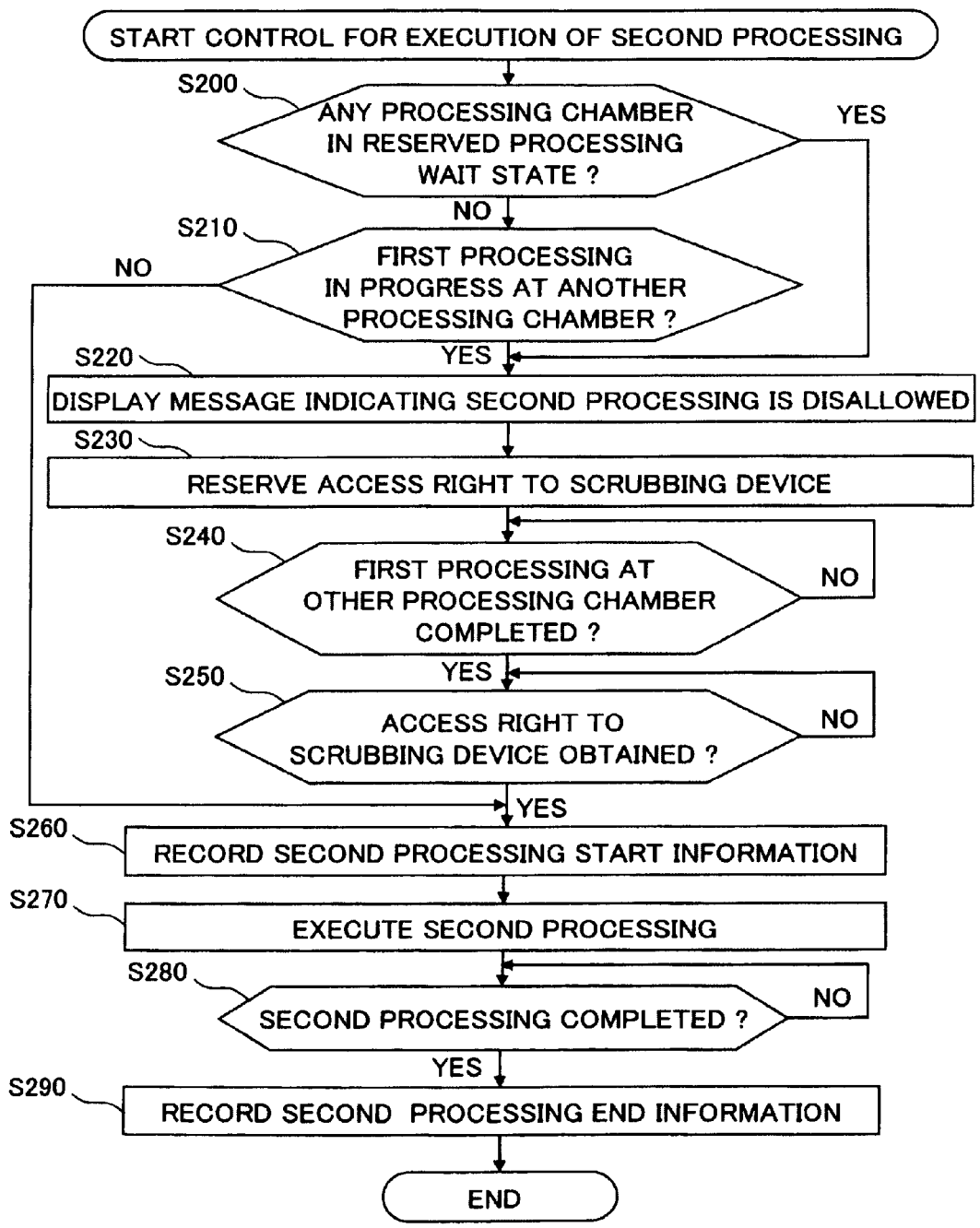
FIG. 13 presents a flowchart of a specific example of control under which the second processing is executed in the embodiment.

First, a specific example of control under which the second processing (e.g., processing of a wafer W) is executed at a given processing chamber among the processing chambers 200A through 200D is explained. FIG. 13 presents a flowchart of the specific example of the control under which the second processing is executed. As shown in FIG. 13, the execution of the second processing (steps S260 through S290) at a given processing chamber starts after executing exclusivity control (steps S200 through S250).

During the exclusivity control, a decision is made in step S200 as to whether or not there is a processing chamber waiting in standby to execute reserved processing. More specifically, a decision is made as to whether or not the table constituting the scrubbing device access right reservation information 494 contains a reservation for processing (job). This decision is made so as to confer priority to processing to be executed at another processing chamber, which has been reserved in the table constituting the scrubbing device access right reservation information 494 and awaiting the execution thereof.

If it is decided in step S200 that there is a processing chamber waiting in standby for the execution of reserved processing, i.e., that there is processing (job) for which a reservation has been made in the table constituting the scrubbing device access right reservation information 494, the operation proceeds to step S220 to bring up a display indicating that the second processing cannot be executed at the display means 450, before the operation shifts into reservation processing in step S230 and subsequent steps to be detailed later. As a result, simultaneous execution of the first processing and the second processing at different processing chambers is prevented. It is to be noted that the warning means 490 may be engaged at this time to warn the operator that the second processing cannot be executed.

If, on the other hand, it is decided in step S200 that there is currently no processing chamber waiting for execution of reserved processing, i.e., that there is no processing (job) the execution of which has been reserved in the table constituting the scrubbing device access right reservation information 494, the operation proceeds to step S210 to make a decision as to whether or not the first processing is in progress in another processing chamber. This decision is made so as to prevent simultaneous execution of the first processing and the second processing at different processing chambers. More specifically, the decision is made based upon the processing status management information 492 stored at the storage means 490.

If it is decided in step S210 that the first processing (e.g., roughing vacuum processing executed initially at atmospheric pressure) is not currently in progress at another processing chamber, the operation shifts into the processing in step S260 and subsequent steps, thereby starting the second processing. If, on the other hand, it is decided in step S210 that the first processing is currently in progress at another processing chamber, the operation proceeds to step S220 to bring up a display indicating that the second processing cannot the executed at the display means 450. At this time, the warning means 470 may be engaged to warn the operator that the second processing cannot be executed.

Then, the reservation processing is executed in steps S230 through S250. During the reservation processing, an access right to the scrubbing device 300 is first reserved in step S230. More specifically, an access right that will allow the use of the scrubbing device 300 (the common discharge system 310) is reserved at the data table constituting the scrubbing device access right reservation information 494 at the storage means 490.

Next, a decision is made in step S240 as to whether or not the first processing at the other processing chamber has ended. This decision is made based upon the processing status management information 492 at the storage means 490. As the first processing having been in progress at the other processing ends, the "first processing" entry corresponding to the other processing chamber in the processing status management information 492 is switched from "1" to "0" and accordingly, the first processing at the other processing chamber can be judged to have ended when the "first processing" entry is switched to "0". If it is decided in step S240 that the first processing having been in progress at the other processing chamber has not ended yet, the operation waits in standby for the first processing at the other processing chamber to end.

If it is decided in step S240 that the first processing having been in progress at the other processing chamber has ended, the operation proceeds to step S250 to make a decision as to whether or not an access right to the scrubbing device 300 has been obtained. This decision is made in correspondence to the order in which reservations have been registered in the scrubbing device access right reservation information 494. The decision as to whether or not an access right to the scrubbing device 300 has been obtained is made by judging, based upon, for instance, the processing status management information 492, as to whether or not the first processing is in progress in another processing chamber. If the first processing is judged to be not in progress at another processing chamber, it is decided that an access right to the scrubbing device 300 has been obtained and, in this case, the operation shifts to the processing in step S260 and subsequent steps, thereby starting the second processing.

If, on the other hand, the first processing is judged to be in progress in another processing chamber, it is decided that an access right to the scrubbing device 300 has not been obtained and the operation waits until an access right to the scrubbing device 300 is obtained. The control follows this flow so as not to execute the second processing if the first processing is underway at yet another processing chamber while the first processing is in progress in a given processing chamber since the exclusivity control does not apply to concurrent executions of the first processing at different processing chambers.

Next, an explanation is given on how the second processing is started. When starting the second processing, second processing start information is recorded in step S260. More specifically, "1" is set (stored) in the "second processing" entry in the data table constituting the processing status management information 492.

Next, the second processing is executed in step S270. The second processing (e.g., processing of a wafer W) is executed by closing the switch-over valve 350 of the scrubbing device 300 and thus switching the common discharge system 310 to the scrubbing common discharge system 320. As a result, the discharge gas from the processing chamber is first scrubbed via the scrubbing means 340 in is then discharged to, for instance, the plant exhaust system.

Next, a decision is made in step S280 as to whether or not the second processing has ended. If it is decided in step S280 that the second processing has ended, second processing end information is recorded in step S290. More specifically, "0" is set (stored) in the "second processing" entry in the data table constituting the processing status management information 492. The second processing sequence that includes the exclusivity control with relation to the first processing thus ends.

Under the control achieved in the first embodiment described above, executed in conjunction with the second processing, the second processing (e.g., processing on a wafer W executed at low pressure) is not executed at any of the remaining processing chambers if the first processing (e.g., roughing vacuum processing executed initially under high pressure conditions) is in progress at any processing chamber. Thus, as long as the first processing is in progress at a given processing chamber and the gas from the processing chamber is discharged through the non-scrubbing common discharge system 330, the scrubbing device 300 at the scrubbing device 300 is not switched over to scrubbing discharge through which the discharge gas is discharged via the scrubbing common discharge system 320. As a result, the gas resulting from processing initially executed at high-pressure, which does not need to be scrubbed, is not discharged via the scrubbing means 340 of the scrubbing device 300, thereby reducing the onus on the scrubbing device 300.

For instance, while the first processing such as roughing vacuum processing executed initially at atmospheric pressure, i.e., at high-pressure, is in progress at the processing chamber 200B and the gas from the processing chamber 200B is discharged through non-scrubbing discharge without going through the scrubbing process at the scrubbing means 340 of the scrubbing device 300, as shown in FIG. 7, execution of the second processing such as processing of a wafer W that needs to be executed under low pressure conditions at any of the other processing chambers, e.g., the processing chamber 200A, is suspended. Thus, the switch-over valve 350 at the scrubbing device 300 is not closed while the first processing is in progress at the processing chamber 200B, as shown in FIG. 8, and the gas discharged from the processing chamber 200B is not discharged via the scrubbing means 340 at the scrubbing device 300. The onus on the scrubbing device 300 is thus reduced.

It is to be noted that while roughing vacuum processing started at atmospheric pressure is in progress, the wafer W is held in standby in, for instance, the common transfer chamber 150, instead of carrying it into the processing chamber, since there may be a residual processing gas or a deposit resulting from the previous processing in the processing chamber and the wafer W held in standby in the processing chamber may become unintentionally processed.

It is to be noted that the first processing described above may be roughing vacuum processing executed initially at atmospheric pressure or it may be auto-check processing, maintenance processing or the like in which roughing vacuum processing is executed initially at atmospheric pressure, as a part thereof. Accordingly, while the first processing such as auto-check processing or maintenance processing is in progress in a given processing chamber, the second processing such as processing of a wafer W is not executed in any of the other processing chambers.

Under these circumstances, the entire auto-check processing or the entire maintenance processing may be designated as the first processing and the execution of the second processing at another processing chamber may be suspended while the first processing is in progress, as described earlier, or only the roughing vacuum processing executed initially at atmospheric pressure as part of the auto-check processing or the maintenance processing alone may be designated as the first processing and the execution of the second processing at another processing chamber may be suspended only while the designated first processing is in progress. As long as the second processing, e.g., the processing of a wafer W, is not simultaneously executed in another processing chamber at least while the roughing vacuum processing executed initially at atmospheric pressure is in progress at a given processing chamber, the scrubbing device 300 is not switched to the scrubbing common discharge system 320 and thus, the gas discharged under high pressure conditions is not discharged via the scrubbing means 340 at the scrubbing device 300.

Accordingly, even while auto-check processing or maintenance processing is in progress at a given processing chamber, the second processing, i.e., the processing of a wafer W, can be executed at another processing chamber, unless the roughing vacuum processing executed initially under atmospheric pressure conditions, as part of the auto-check processing or the maintenance processing is in progress. If, on the other hand, the roughing vacuum processing executed initially under atmospheric pressure conditions as part of the auto-check processing or the maintenance processing is in progress in a given processing chamber, the second processing such as the processing of a wafer W cannot be executed in any of the other processing chambers.

Examples of the second processing include processing for opening the gas supply valve 214 to draw in the processing gas executed as part of maintenance processing or cleaning processing, as well as processing of a wafer W. When the gas supply valve 214 is opened, the processing chamber needs to be discharged and, for this reason, if the processing gas drawn into the processing chamber requires discharge gas scrubbing, the processing gas needs to be discharged via the scrubbing means 340 at the scrubbing device 300 by switching to the scrubbing common discharge system 320. Accordingly, while the first processing such as roughing vacuum processing executed initially under atmospheric pressure conditions is in progress in a given processing chamber, the second processing, e.g., opening the gas supply valve 214, cannot be executed in any of the other processing chambers.

It is to be noted that the start and the end of the processing of a wafer W representing an example of the second processing in the embodiment may be defined as follows. Namely, when continuously processing a plurality of wafers W (e.g., a single lot of wafers) at the subject processing chamber, processing starts as the continuous processing operation for the lot starts and ends as the continuous processing operation ends. If, on the other hand, wafers W are to be individually processed, one wafer at a time, at the subject processing chamber, the processing starts as the process recipe execution starts before a wafer W is carried into the processing chamber and ends as the elimination of the static electricity in the processing chamber is completed following the transfer of the processed wafer. If waferless cleaning (WLDC) is to be subsequently executed by drawing in the processing gas following the transfer of the outgoing wafer in order to remove any substances deposited on the interior of the processing chamber, the wafer processing ends as the waferless cleaning is completed. Since the use of the scrubbing device 300 must be exclusively awarded to the processing chamber while the processing of the wafer W is executed, from the beginning to the end of the processing, it is necessary to suspend execution of the first processing over the entire duration of the wafer processing operation.

In addition, if an error occurs in the substrate processing apparatus 100 and the processing of the wafer W stops, it may be necessary to engage the scrubbing device 300 for the subsequent recovery processing or for processing (such as static electricity elimination) executed following the recovery processing. In such a case, the reservations registered in the scrubbing device access right reservation information 494 should be first canceled and then a new access right to the scrubbing device 300 for the recovery processing should be obtained. Likewise, if the operation shifts into maintenance processing while the subject processing chamber has been in a processing wait state under the first processing/second processing exclusivity control, the reservation registered in the scrubbing device access right reservation information 494 should be first canceled and then an access right to the scrubbing device 300 should be newly obtained for the recovery processing. As described above, when executing recovery processing or maintenance processing is executed, any existing reservation registered in the scrubbing device access right reservation information 494 is first canceled and thus, the problem of the scrubbing device 300 being unavailable for recovery processing or maintenance processing on account of an existing reservation for another processing job in the scrubbing device access right reservation information 494 does not occur.

In addition, if the operation shifts into independent maintenance processing executed by isolating the subject processing chamber, the first processing/second processing exclusivity control such as that shown in FIG. 12 or FIG. 13 is not executed for the subject processing chamber. Accordingly, the first processing or the second processing can be executed in the subject processing chamber in conjunction with such independent maintenance processing, regardless of whether or not the first processing or the second processing is currently being executed in another processing chamber. Also, if the operation in a given processing chamber where processing is underway by engaging the scrubbing device 300 shifts into independent maintenance processing, the use of the scrubbing device 300 in combination with the particular processing chamber may be canceled and the use of the scrubbing device 300 may be awarded to an other processing chamber with a reservation registered in the scrubbing device access right reservation information 494.

In addition, while an explanation is given above in reference to the first processing/second processing exclusivity control achieved in the embodiment on an example in which a specific type of reservation processing (e.g., steps S130 through S150 in FIG. 12 or steps S230 through S250 in FIG. 13) is executed if either of the first processing and the second processing is in progress at a given processing chamber when the other processing needs to be executed at another processing chamber, the present invention is not limited to this example and if either of the first processing or the second processing is already in progress at a given processing chamber when the other processing needs to be executed at another processing chamber, the operation may end in an error without executing any reservation processing.

Furthermore, the reservation processing described above does not need to be executed under the following circumstances. For instance, when the maintenance processing executed in response to operator instructions includes the first processing or the second processing, e.g., wafer processing executed during maintenance, processing for operating the switch-over valve 270 and the gas supply valve 214 at the auxiliary discharge system 240 by themselves, cycle purge processing for discharging residual processing gas remaining in the processing chamber by alternately evacuating and charging the chamber so as to switch between a vacuum and a pressure of one atmosphere, processing for charging the processing chamber to a pressure of one atmosphere or cleaning processing, and the subject processing chamber where such processing is to be executed is set in a processing wait state under the first processing/second processing exclusivity control described earlier, the execution of the processing may be disabled through an interlock without executing the reservation processing described earlier. Since the substrate processing apparatus 100 is likely to be monitored by an operator when any of the processing listed above is to be executed, the processing does not need to be automatically executed through reservation processing and the operability of the apparatus improves by enabling free operation by the operator.

In addition, while an explanation is given above in reference to the embodiment on an example in which the discharge systems 220A through 220D of all the processing chambers 200A through 200D of the substrate processing apparatus 100 are connected with the common scrubbing device 300 via the common discharge system 310, the discharge systems of only some of the processing chambers may be connected to the scrubbing device via the common discharge system, as long as the discharge systems of at least two processing chambers are connected to the scrubbing device.

For instance, a first scrubbing device may be connected via a first common discharge system to the processing chambers 200A and 200B, with a second scrubbing device connected with the processing chambers 200C and 200D via a second common discharge system. In this case, the first processing/second processing exclusivity control in the embodiment will be executed in correspondence to each of the processing chambers connected to either common discharge system. Alternatively, a scrubbing device may be connected to the processing chambers 200A through 200C via a common discharge system and another scrubbing device may be connected to the processing chamber 200D alone. In this configuration, the first processing/second processing exclusivity control achieved in the embodiment will be executed for the processing chambers 200A through 200C.

While an explanation is given above in reference to the embodiment on an example in which the common discharge system 310 includes the scrubbing common discharge system 320 for evacuating each processing chamber via the scrubbing means 340 and the non-scrubbing common discharge system 330 through which discharge gas is discharged directly without being scrubbed at the scrubbing means 340, both disposed within the scrubbing device 300, the present invention is not limited to this example. For instance, the scrubbing common discharge system 320 alone may be disposed in the scrubbing device 300, with the non-scrubbing common discharge system 330 provided as a device independent of the scrubbing device 300. This configuration allows the present invention to be adopted in conjunction with a scrubbing device 300, which does not include a non-scrubbing common discharge system 330.

As explained earlier, the gas supply system 210 may adopt a structure other than that shown in FIG. 2. It goes without saying that the present invention may be adopted equally effectively regardless of a specific structure that may be assumed in the gas supply system 210 in correspondence to, for instance, the type or the flow rate of the gas to be supplied into the processing chamber 200. For instance, if multiple types of gases are to be drawn into the processing chamber, a piping structure that includes a plurality of gas supply systems each connecting a gas supply source of a specific type of gas and a gas supply valve may be adopted so as to allow a mixture of the various types of gases to be drawn into the processing chamber 200. In such a case, the piping system may include a plurality of gas supply systems each corresponding to one of the multiple types of gases to be used for the processing, or if a mixed gas containing an inert gas is to be used as the processing gas, a gas supply system for the inert gas may be added into the processing gas supply system. Moreover, an inert gas supply system may be added as a supply system for supplying gas to be used when charging the processing chamber to a pressure of one atmosphere.

Figure 14:
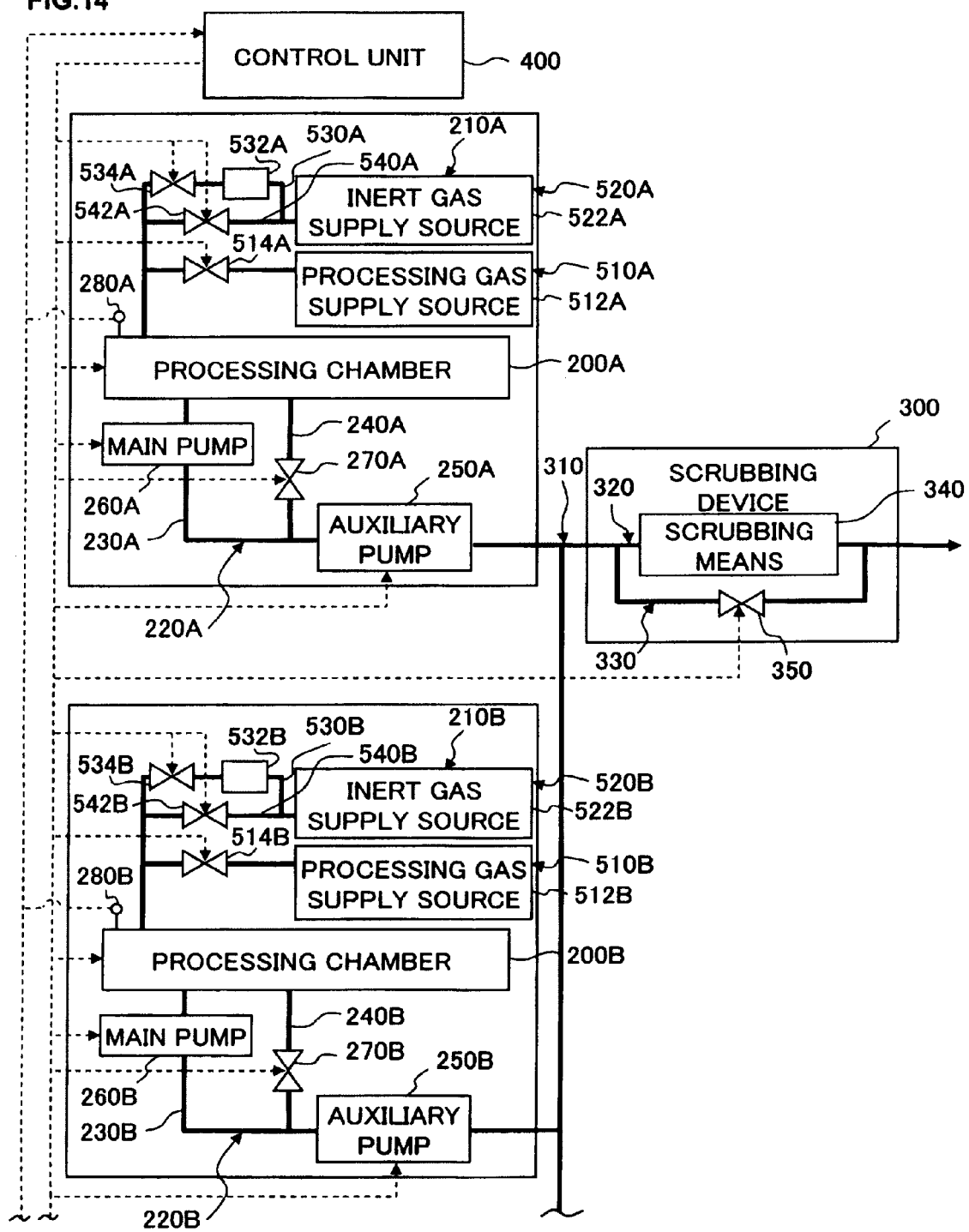
FIG. 14 is a block diagram presenting a specific example of a structure that may be adopted in the gas supply systems in FIG. 2.

A structural example that may be adopted in the gas supply system 210 in FIG. 2, which includes a processing gas supply system and an inert gas supply system, is now explained in reference to FIG. 14. In this example, the inert gas supply system is used when executing wafer processing and also when executing particle reduction processing by using a gas shock wave. The wafer processing is executed by continuously supplying the inert gas (e.g., $N_2$ gas) at a predetermined flow rate to be used as a pressure adjusting gas, together with the processing gas, into the processing chamber. Particles in the processing chamber may be eliminated with the gas shock wave by continuously supplying the inert gas (e.g., $N_2$ gas) at a high flow rate into the processing chamber where the inert gas is used as, for instance, a purge gas. As in the explanation given earlier in reference to FIG. 2, the following explanation is given simply by using reference numeral 200 to refer to a given processing chamber representing the processing chambers 200A through 200D. Accordingly, the processing chamber 200 may be any of the processing chambers 200A through 200D, and the gas supply system 210 may be any of the gas supply systems 210A through 210D corresponding to the individual processing chambers 200A through 200D.

The gas supply system 210 in FIG. 14 is constituted by connecting a piping at which a processing gas supply system 510 and an inert gas supply system 520 are made to join each other, to the processing chamber 200. The processing gas supply system 510 may include, for instance, a processing gas supply source 512 and a gas supply valve 514. It is to be noted that the processing gas supply system 510 may instead adopt a piping structure that includes a plurality of gas supply systems each corresponding to a specific type of gas constituting the processing gas and disposed in parallel to one another and allows a mixture of the individual constituents of the processing gas to be drawn into the processing chamber 200.

The inert gas supply system 520 may include, for instance, an inert gas supply source 522, and may be constituted by connecting in parallel a low flow rate supply system a first supply system through which the inert gas from the inert gas supply source 522 can be drawn into the processing chamber 200 at a constant low flow rate and a high flow rate supply system (a second supply system) 540 through which the inert gas from the inert gas supply source 522 can be drawn into the processing chamber 200 at a high flow rate, set higher than the flow rate at the low flow rate supply system 530.

The low flow rate supply system 530 is constituted with a metering valve 532 through which the flow rate of the inert gas from the inert gas supply source 522 is adjusted to a predetermined flow rate and a gas supply valve 534. The metering valve 532 may be a fixed valve constituted with, for instance, an orifice or a choke, or it may be a variable valve that enables fine adjustment of the flow rate. Alternatively, the gas supply valve 534 and the metering valve 532 may be constituted as an integrated orifice valve. The low flow rate supply system 530 is engaged to draw the inert gas such as $N_2$ gas to be used as a pressure adjusting gas into the processing chamber 200 when drawing the processing gas into the processing chamber 200 to execute, for instance, wafer processing. When the low flow rate supply system 530 is engaged for such wafer processing, the flow rate of the inert gas, which is adjusted at the metering valve 532, should be set to a level at which the pressure in the processing chamber 200 can be adjusted.

The high flow rate supply system 540 is connected downstream of the low flow rate supply system 530 via a gas supply valve 542. The high flow rate supply system 540 is used for, for instance, cleaning processing executed by drawing in the inert gas to eliminate particles and the like present in the processing chamber 200. Such cleaning processing may be particle reduction processing (NPPC) during which the processing chamber 200 is evacuated while drawing in the inert gas such as $N_2$ gas at a high flow rate and particles and the like having been collected on the inner walls of the processing chamber 200 are flaked off the inner walls by a shock wave (a pressure wave transmitted at a speed exceeding the speed of sound) generated under specific conditions and are discharged together with the discharge gas. The inert gas flow rate at the high flow rate supply system 540 engaged for such particle reduction processing should be set to a level at which particles and the like in the processing chamber 200 can be eliminated with a gas shock wave.

It is to be noted that while the inert gas supply system 520 in the piping structure shown in FIG. 14 includes two supply systems, i.e., the low flow rate supply system 530 and the high flow rate supply system 540, the present invention is not limited to this example. For instance, the inert gas supply system 520 may be constituted with a single supply system. In such a case, the flow rate of the inert gas may be adjusted to a low level for wafer processing and the inert gas flow rate may be adjusted to a high level for particle reduction processing via a flow regulating valve. However, since the inert gas is used as the pressure adjusting gas during the wafer processing, it is necessary to ensure her that the inert gas is supplied at a constant low flow rate during the wafer processing in either of the structures described above.

While the inert gas supply system 520 may adopt a single-system structure as described above, it may become difficult depending upon the capacity of the flow regulating valve, which needs to be repeatedly adjusted between the high flow rate setting and the low flow rate setting to sustain a constant low flow rate. By adopting a two-system structure in the inert gas supply system 520 as shown in FIG. 14, the need for a flow regulating valve for adjusting the flow rate setting from high to low and vice versa is eliminated and, as a result, a constant low flow rate can be sustained at all times with a high level of reliability at low cost. In addition, the inert gas supply system 520 adopting such a two-system structure facilitates the switch-over control for the common discharge system 310 at the scrubbing device 300, as explained later.

When processing a wafer W in the processing chamber 200 adopting the piping structure shown in FIG. 14, the processing chamber 200 is first discharged, as in the case of the processing chamber 200 adopting the piping structure in FIG. 2, until the pressure inside the processing chamber 200 is lowered to a predetermined level while the gate valve of the processing chamber 200 is kept in a closed state. Once the discharge processing is completed, the gate valve is opened and the wafer W is carried into the processing chamber 200. After the wafer W is placed on the stage, the gate valve is closed and the operation shifts to the processing of the wafer W.

Figure 15:
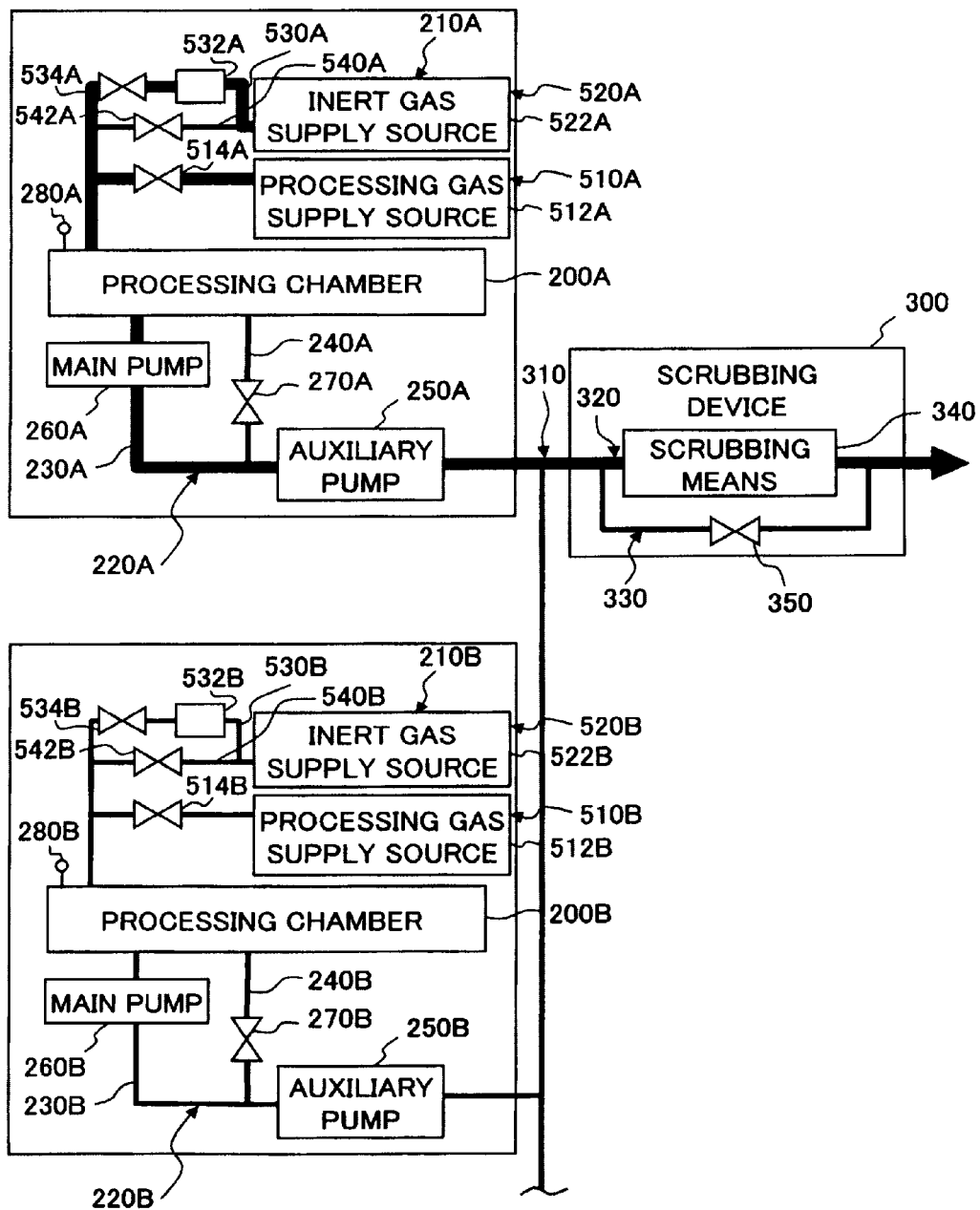
FIG. 15 illustrates a flow of discharge gas that may be observed when wafer processing is executed at a processing chamber adopting the piping structure in FIG. 14.

At this time, the switch-over valve 270 is closed to switch the discharge system 220 to the main discharge system 230, as shown in FIG. 15. As the gas supply valve 514 of the processing gas supply system 510 is opened in this state, the processing gas from the processing gas supply source 512 is drawn into the processing chamber 200 and the gas supply valve 534 is opened while leaving the gas supply valve 542 of the inert gas supply system 520 in a closed state to draw the inert gas (e.g., $N_2$ gas) from the inert gas supply source 522 into the processing chamber 200 via the low flow rate supply system 530, thereby starting the processing of the wafer W. During this process, the inert gas acts as a pressure adjusting gas so as to sustain the pressure inside the processing chamber 200 at a predetermined level. The wafer W is processed over a predetermined length of time in this state.

When the processing gas containing a harmful constituent is used to process the wafer W, a discharge gas containing a harmful substance is discharged from the processing chamber 200 as described above. Accordingly, the switch-over valve 350 of the scrubbing device 300 is closed to switch the common discharge system 310 to the scrubbing common discharge system 320. As a result, the gas discharged from the processing chamber 200 as the wafer W is processed is first scrubbed and is then discharged to, for instance, the plant exhaust system.

Next, after the processing of the wafer W is completed and the processed wafer is carried out, particle reduction processing may be executed as described earlier by opening the switch-over valve 270 and switching the discharge system 220 to the auxiliary discharge system 240. In this case, the gas supply valve 542 is opened while the gas supply valve 514 at the processing gas supply system 510 and the gas supply valve 534 at the inert gas supply system 520 are sustained in a closed state to draw the inert gas (e.g., $N_2$ gas) from the inert gas supply source 522 into the processing chamber 200 via the high flow rate supply system 540. As a result, the gas shock wave generated with the inert gas (e.g., $N_2$ gas) flakes off particles having accumulated on the inner walls and the like at the processing chamber 200, which are then discharged together with the discharge gas.

Figure 16:
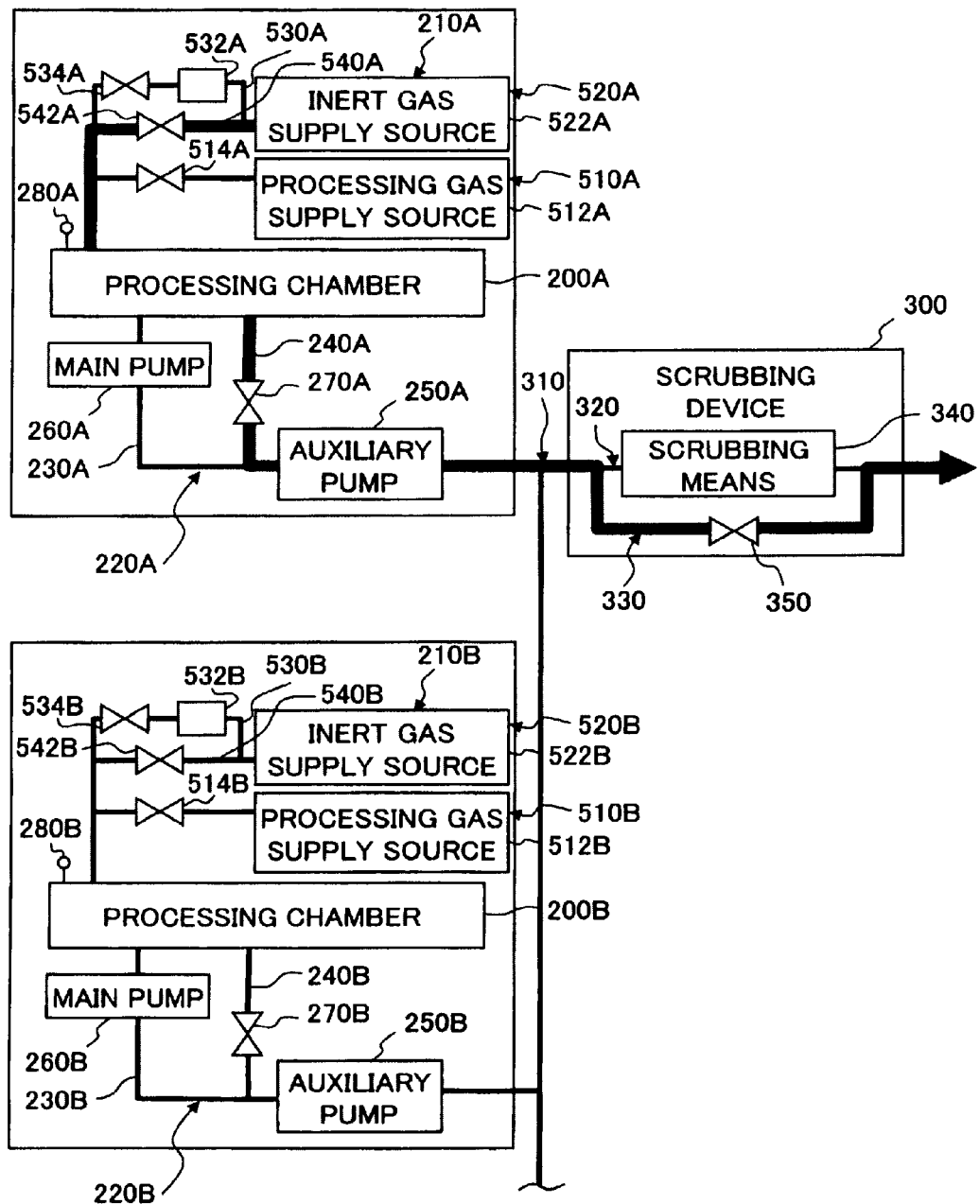
FIG. 16 illustrates a flow of discharge gas that may be observed when particle reduction processing is executed at a processing chamber adopting the piping structure in FIG. 14.

The inert gas such as $N_2$ gas with no harmful substances contained therein used in such particle reduction processing does not need to be scrubbed at the scrubbing device 300. If the inert gas was discharged via the scrubbing means 340 at the scrubbing device 300, the onus on the scrubbing device 300 would increase. Accordingly, the particle reduction processing is executed by directly discharging the gas from the processing chamber 200 without scrubbing it at the scrubbing means 340, as in the cycle purge explained earlier. More specifically, the switch-over valve 350 at the scrubbing device 300 is opened to switch the common discharge system 310 to the non-scrubbing common discharge system 330, as shown in FIG. 16. The onus on the scrubbing device 300 is thus reduced.

It is to be noted that while the inert gas may be drawn into the processing chamber 200 via the high flow rate supply system 540 alone, as shown in FIG. 16, for the particle reduction processing, or the particle reduction processing may be executed by drawing the inert gas into the processing chamber 200 via both the high flow rate supply system 540 and the low flow rate supply system 530 by opening both the gas supply valves 542 and 534. In this case, the inert gas can be supplied into the processing chamber 200 in an even larger quantity.

In addition, when processing is executed concurrently at the processing chambers 200A, 200B and the like adopting the piping structure shown in FIG. 14, exclusivity control is executed in conjunction with the first processing and the second processing, as shown in FIGS. 12 and 13. In this case, the processing that requires the processing gas drawn in via the processing gas supply system 510 and the inert gas drawn in via the low flow rate supply system 530, as shown in FIG. 15, e.g., wafer processing, is executed by switching the common discharge system 310 to the scrubbing common discharge system 320, and thus constitutes the second processing. The processing that requires the inert gas drawn in via the high flow rate supply system 540 (or both the high flow rate supply system 540 and the low flow rate supply system 530) is executed by switching the common discharge system 310 to the non-scrubbing common discharge system 330 and thus constitutes the first processing.

Under the exclusivity control, particle reduction processing equivalent to the first processing is not executed at the processing chamber 200B and the like while wafer processing equivalent to the second processing is in progress at, for instance, the processing chamber 200A, and wafer processing equivalent to the second processing is not executed in the other processing chamber 200B and the like while particle reduction processing equivalent to the first processing is in progress at the processing chamber 200A. As a result, simultaneous execution of the first processing such as that described above and the second processing such as that described above at different processing chambers are prevented. Thus, in the substrate processing apparatus having the processing chambers 200 adopting a piping structure such as that shown in FIG. 14, too, the onus on the scrubbing device 300 is reduced and, at the same time, no discharge gas that requires scrubbing is directly without first being scrubbed.

Figure 17:
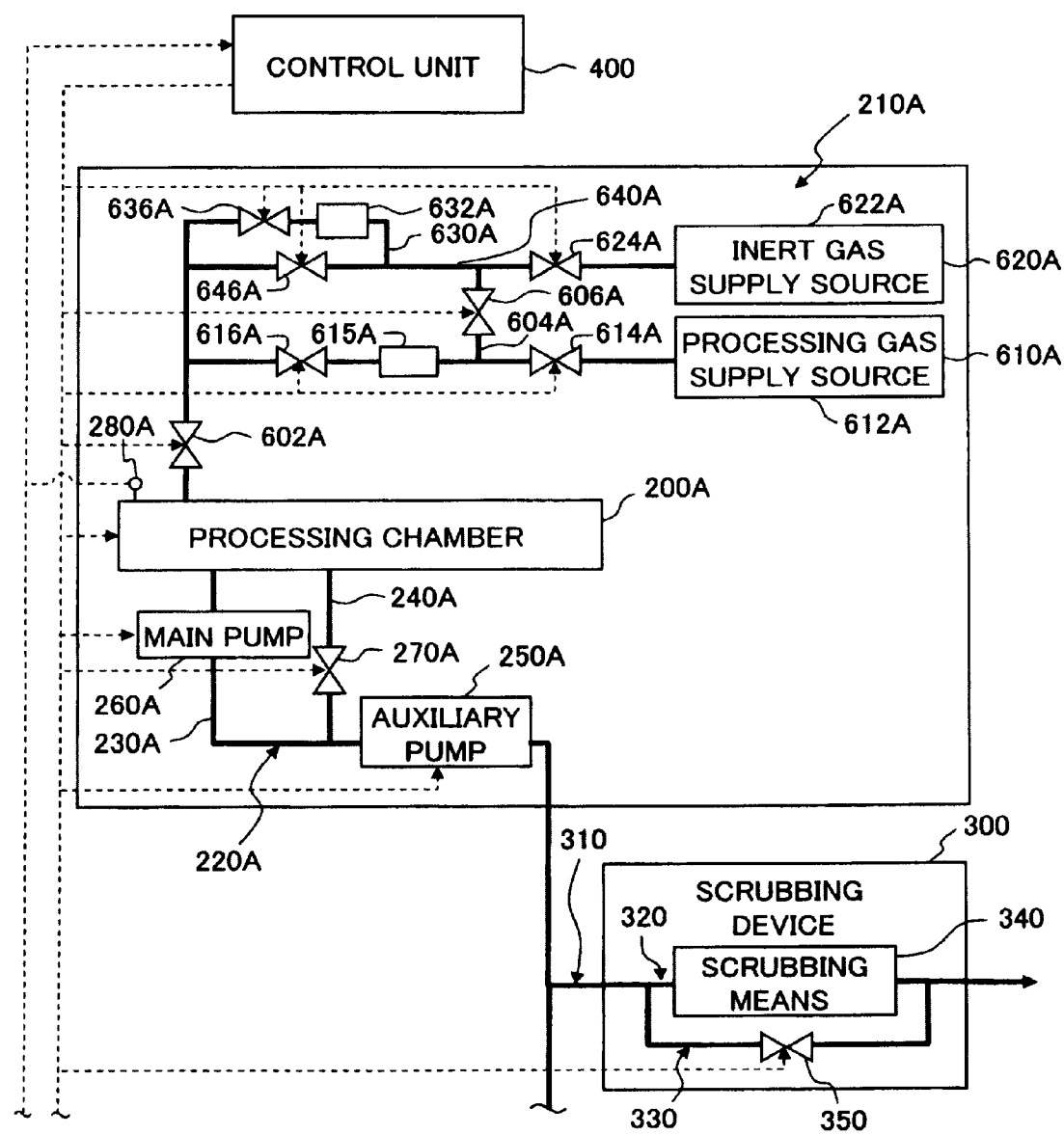
FIG. 17 is a block diagram presenting another specific example of a structure that may be adopted in the gas supply system in FIG. 2.

Next, another structural example that may be adopted in the gas supply system 210 in FIG. 2 is explained in reference to drawings. FIG. 17 is a block diagram showing another structural example that may be adopted in the gas supply system 210. In the example presented in FIG. 17, the inert gas supply system in FIG. 14 is achieved as an inert gas charging system that charges the processing chamber with inert gas (e.g. $N_2$ gas) so as to adjust the pressure in the processing chamber to one atmosphere. Such an inert gas supply system is used for particle reduction processing (e.g., two-stage NPPC to be detailed later) in the processing chamber as well as when charging the processing chamber to a pressure of one atmosphere.

In the gas supply system 210 shown in FIG. 17, the piping of a processing gas supply system 610 and the piping of an inert gas supply system 620 used as an inert gas charging system are conjoined and the conjoined piping is connected to the processing chamber 200 via a main valve 602. The processing gas supply system 610 may include a processing gas supply source 612, an upstream-side gas supply valve 614, a flow regulator (e.g., a mass flow controller) 615 and a downstream-side gas supply valve 616. It is to be noted that the processing gas supply system 610 may adopt a piping structure that includes a plurality of gas supply systems each corresponding to a specific type of gas constituting the processing gas, disposed in parallel to one another, so as to draw the individual types of gases constituting the processing gas as a mixture into the processing chamber 200.

The inert gas supply system 620 may include, for instance, an inert gas supply source 622 and may be constituted by connecting in parallel a low flow rate supply system (a first supply system) through which the inert gas from the inert gas supply source 622 can be drawn into the processing chamber 200 at a constant low flow rate and a high flow rate supply system (a second supply system) 640 through which the inert gas from the inert gas supply source 622 can be drawn into the processing chamber 200 at a high flow rate, set higher than the flow rate at the low flow rate supply system 630.

The low flow rate supply system 630 is constituted with a metering valve 632 through which the flow rate of the inert gas from the inert gas supply source 622 is adjusted to a constant flow rate and a downstream-side gas supply valve 636. The metering valve 632 may be a fixed valve constituted with, for instance, an orifice or a choke, or it may be a variable valve that enables fine adjustment of the flow rate. Alternatively, the downstream-side gas supply valve 636 and the metering valve 632 may be constituted as an integrated orifice valve. The high flow rate supply system 640 is connected downstream of the low flow rate supply system 630 via a downstream-side gas supply valve 646.

The processing gas supply system 610 and the inert gas supply system 620 are connected with each other via a communicating pipe 604. More specifically, the downstream side of the upstream-side gas supply valve 614 at the processing gas supply system 610 and the downstream side of the upstream-side gas intake valve 624 at the inert gas supply system 620 are connected with each other via the communicating pipe 604 which includes a communicating valve 606. As the communicating valve 606 is opened, the inert gas from the inert gas supply system 620 is guided via the communicating pipe 604 to the flow regulator 615 and the downstream-side gas supply valve 616 in the processing gas supply system 610 and the main valve 602, and is then taken into the processing chamber 200. Thus, the inert gas from the inert gas supply system 620 can be drawn into the processing chamber 200 after its flow rate is adjusted at the flow regulator 615 of the processing gas supply system 610.

Next, a specific example of cleaning processing that may be executed in the processing chamber 200 adopting the piping structure shown in FIG. 17 is explained. Such cleaning processing may be particle reduction processing (NPPC) during which particles and the like having been collected on the inner walls of the processing chamber 200 are flaked off the inner walls and the like by a shock wave (a pressure wave transmitted at a speed exceeding the speed of sound) generated under specific conditions as the inert gas such as $N_2$ gas is briefly drawn into the processing chamber at a high flow rate and the particles are discharged together with the discharge gas.

Figure 18:
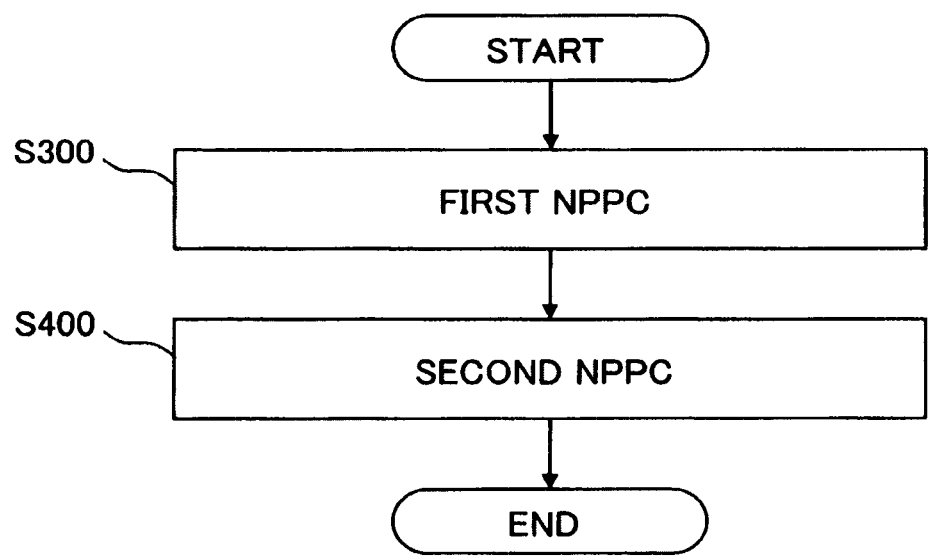
FIG. 18 presents a flowchart of a specific example of control under which the particle reduction processing is executed at a processing chamber adopting the piping structure in FIG. 17.

Such particle reduction processing may be executed under control executed by the control unit 400 as shown in, for instance, FIG. 18. FIG. 18 presents a flowchart of a specific example of control under which particle reduction processing may be executed. The particle reduction processing (NPPC) in this example includes two phases of NPPC, i.e., first NPPC (step S300) executed as first particle reduction processing and second NPPC (step S400) executed as second particle reduction processing, as shown in FIG. 18. The first NPPC is regular low pressure NPPC executed in a low-pressure environment. The second NPPC is a high-pressure NPPC executed in a high pressure environment, during which cleaning processing is executed by using a gas shock wave.

Figure 19:
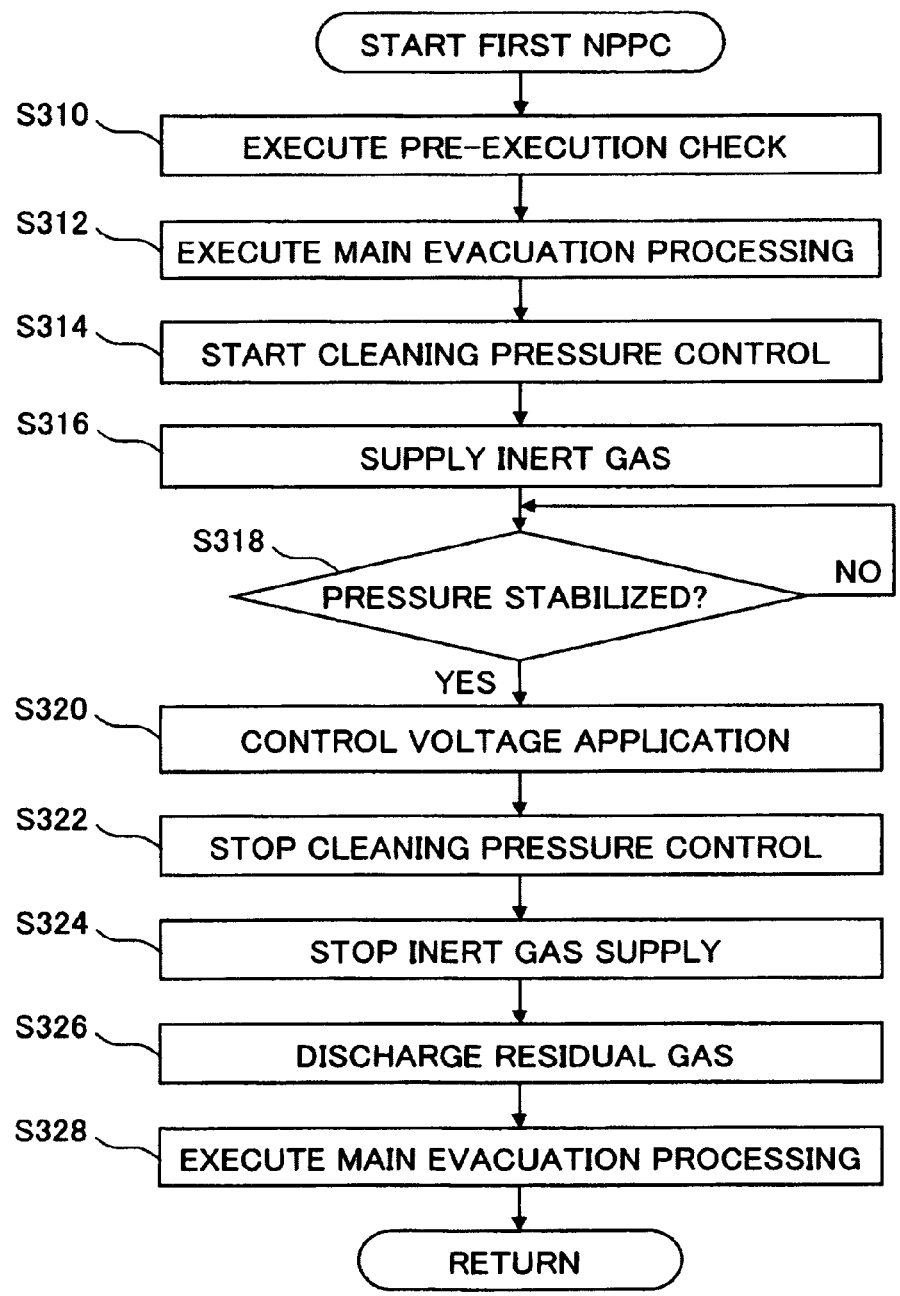
FIG. 19 presents a flowchart of a specific example of the first NPPC in FIG. 17.

A specific example of the first NPPC processing (step S300) is now explained in reference to FIG. 19. The first NPPC processing is started by first executing a pre-execution check in step S310 as shown in FIG. 19. The pre-execution check is executed to ensure that the processing chamber 200 is in a state that enables a normal execution of NPPC. For instance, if wafer processing is in progress, if a wafer is currently present in the processing chamber, if an outgoing wafer is being carried out of the processing chamber or if maintenance work is in progress in the processing chamber 200 is not in conditions under which normal execution of NPPC can be carried out.

The wafer processing may include phases such as a processing gas drawing phase, a back gas drawing phase during which a back gas for wafer temperature adjustment or the like is drawn in, a control phase during which the electrostatic chuck for holding the wafer is controlled and a control phase during which the high frequency power sources are controlled. The outgoing wafer transfer may include a gate opening phase during which the gate to the processing chamber is opened. The maintenance work may include a lid opening phase during which the lid of the processing chamber is opened.

Under any of those circumstances, the processing chamber 200 is not in an NPPC enabling state. For this reason, the state of the processing chamber 200 is checked in advance, and if it is decided that the processing chamber 200 is not in an NPPC enabling state, the NPPC processing ends in an error, whereas if the processing chamber 200 is judged to be in an NPPC enabling state, the processing in step S312 and subsequent steps is executed.

Main discharge processing is executed in step S312. More specifically, the processing chamber 200 is evacuated via the main pump 260 until a predetermined vacuum pressure is achieved in the chamber. It is to be noted that if the predetermined level of vacuum pressure is not achieved when a predetermined length of time has elapsed, a timeout occurs and the processing ends in an error. In step S314, pressure control via a pressure adjusting valve (APC) (not shown) at the main discharge system 230 is started in order to set the pressure inside the processing chamber 200 to a predetermined cleaning pressure level.

Then, the inert gas (e.g., N$_2$ gas) is drawn into the processing chamber 200 in step S316. The inert gas is drawn in from the processing gas supply system 610 via the communicating pipe 604 in the step. More specifically, the upstream-side gas supply valve 624 and the communicating valve 606 are opened while leaving the downstream-side gas supply valves 636 and 646 in the inert gas supply system 620 in a closed state and, at the same time, the downstream-side gas supply valve 616 and the main valve 602 are opened while leaving the upstream-side gas supply valve 614 of the processing gas supply system 610 in a closed state. As a result, the inert gas (e.g., N$_2$ gas) from the inert gas supply source 622 is drawn into the processing chamber 200 from the processing gas supply system 610 via the communicating pipe 604.

Then, in step S318, a decision is made as to whether or not the pressure inside the processing chamber 200 has become stable and if it is decided that the pressure in the processing chamber 200 has become stable, the operation proceeds to step S320 to execute voltage application control. In this step, the voltage applied to the electrostatic chuck used to hold fast the wafer onto the lower electrode is controlled. In more specific terms, voltage polarity conversion control during which the voltage applied to the electrostatic chuck is first set to a positive value, the voltage is turned off (set to 0) after a predetermined length of time (e.g. 2 sec) elapses, then the voltage applied to the electrostatic chuck is set to a negative value and the voltage is turned off (set to 0) after a predetermined length of time (e.g. 2 sec) elapses, is repeatedly executed over a predetermined number of cycles (e.g., five cycles). Through this control, it becomes easier to scatter particles present inside the processing chamber 200, and thus, the particles can be removed effectively. Once the voltage application control ends, the cleaning pressure control is stopped in step S322 by, for instance, fully opening the pressure adjusting valve (APC) (not shown) of the main discharge system 230.

Next, the supply of the inert gas is stopped by closing the upstream-side gas supply valve 624 at the inert gas supply system 620 in step S324. At this time, the communicating valve 606, the downstream-side gas supply valve 616 of the processing gas supply system 610 and the main valve 602 are left in an open state. In this condition, discharge processing is executed to discharge any residual gas present in the processing gas supply system 610 and the communicating pipe 604 in step S326.

Next, main discharge processing is executed again in step S328. More specifically, the processing chamber 200 is evacuated via the main pump until a predetermined vacuum state is achieved. It is to be noted that if the predetermined vacuum state is not achieved when a predetermined length of time has elapsed, a timeout occurs and the processing ends in an error. Once the sequence of the first NPPC is completed as described above, the second NPPC is executed.

Figure 20:
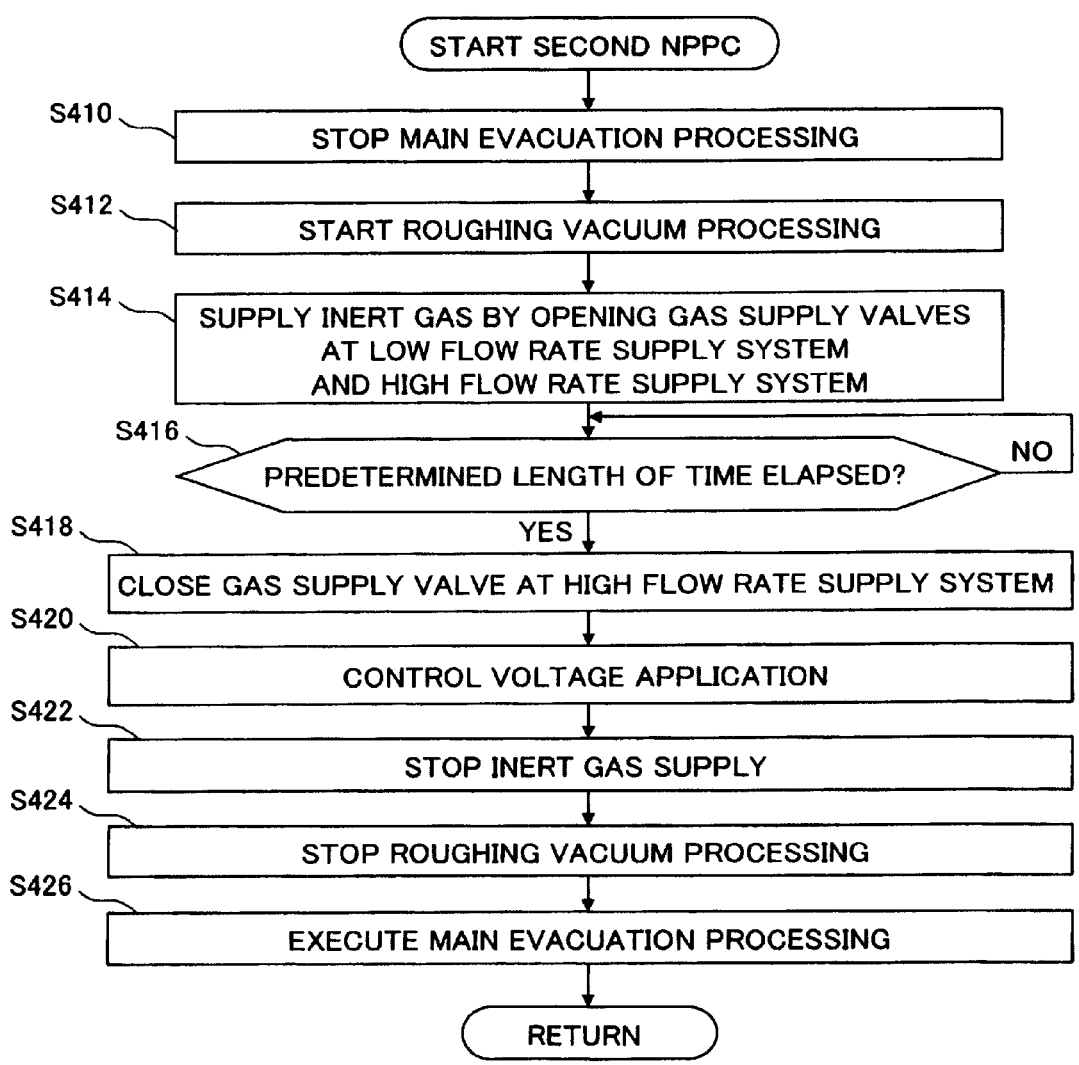
FIG. 20 presents a flowchart of a specific example of the second NPPC in FIG. 17.

In reference to FIG. 20, a specific example of the second NPPC processing (step S400) is explained. After the second NPPC is started, the main discharge processing is first stopped by closing the pressure adjusting valve (APC) (not shown) of the main discharge system 230 in step S410 in FIG. 20. Then, in step S412, roughing vacuum processing is started. Namely, the processing chamber 200 is evacuated via the auxiliary discharge system 240 by driving the auxiliary pump 250. It is desirable to close the protective valve at the vacuum pressure gauge at the start of the second NPPC so as to protect the vacuum pressure gauge during the second NPPC processing.

Figure 22:
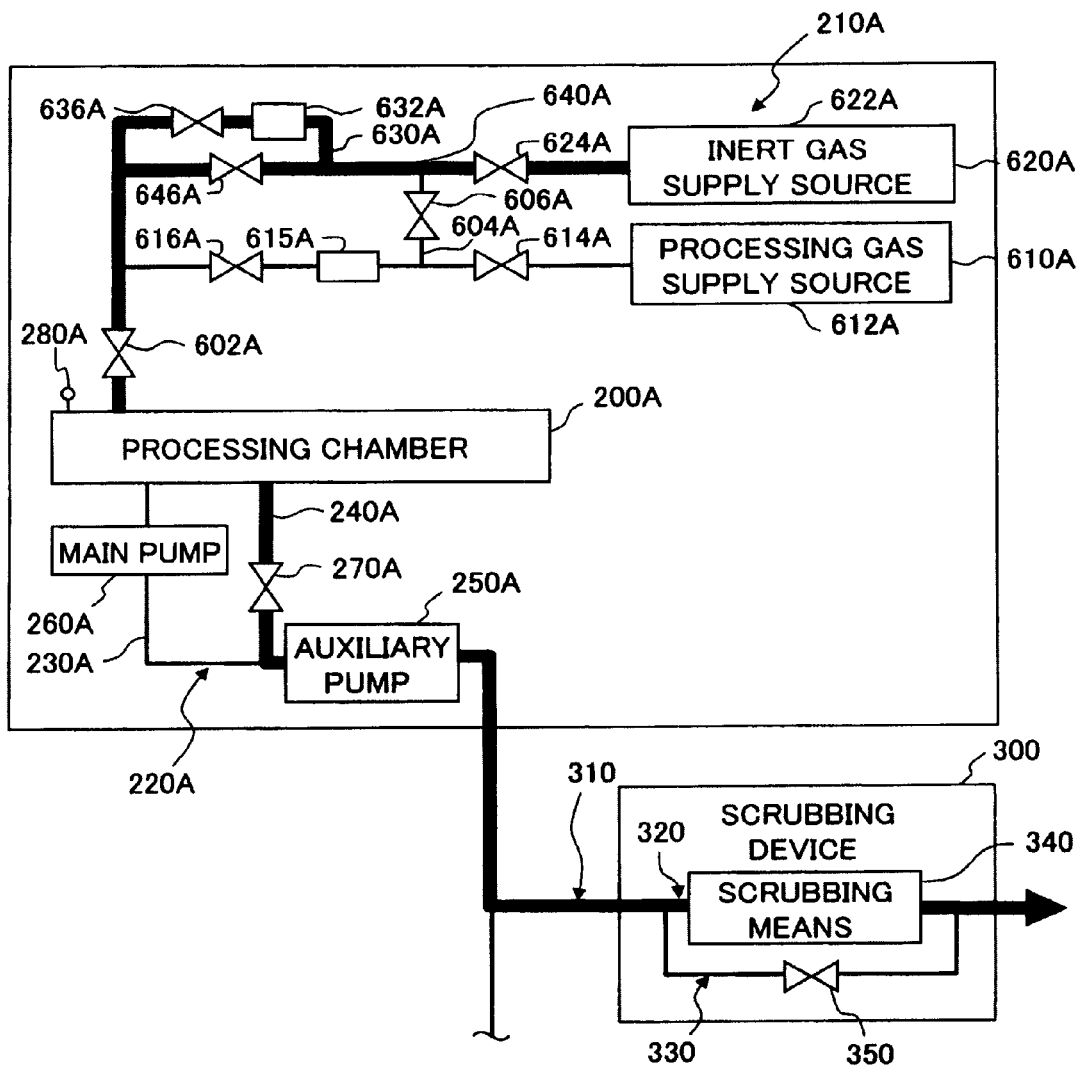
FIG. 22 illustrates a flow of discharge gas that may be observed when the second NPPC is executed at a processing chamber adopting the piping structure in FIG. 17.

Then, in step S414, the inert gas is drawn into the processing chamber 200 through the inert gas supply system 620, which is an inert gas charging system to adjust the pressure in the processing chamber to one atmosphere. In this step, the inert gas is drawn in by using both the low flow rate supply system 630 and the high flow rate supply system 640. Namely, the inert gas is drawn in by opening the upstream-side gas supply valve 624 and also by opening the downstream-side gas supply valves 636 and 646 and the main valve 602, as shown in FIG. 22. Then, in step S416, the operation waits for a predetermined length of time (e.g., 5 sec) to elapse.

Figure 23:
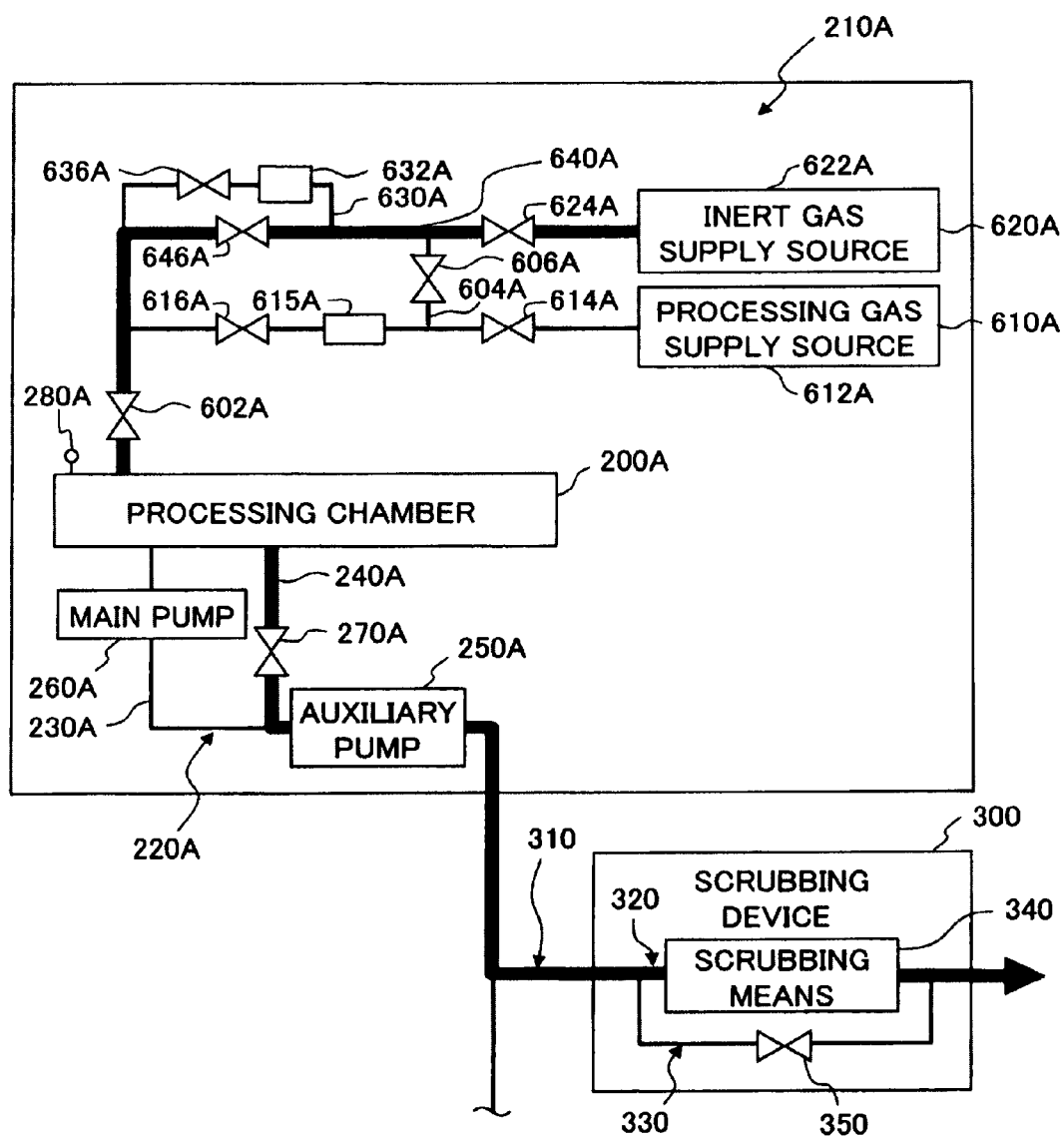
FIG. 23 illustrates a flow of discharge gas that may be observed when the second NPPC is executed at a processing chamber adopting the piping structure in FIG. 17.
Figure 24:
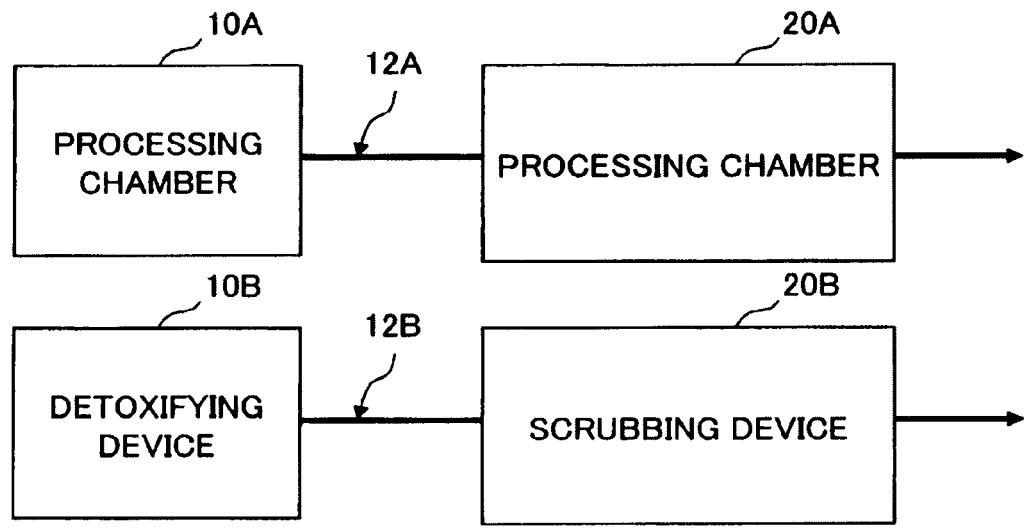
FIG. 24 is a block diagram presenting an example of a substrate processing apparatus in the related art, which includes scrubbing devices.
Figure 25:
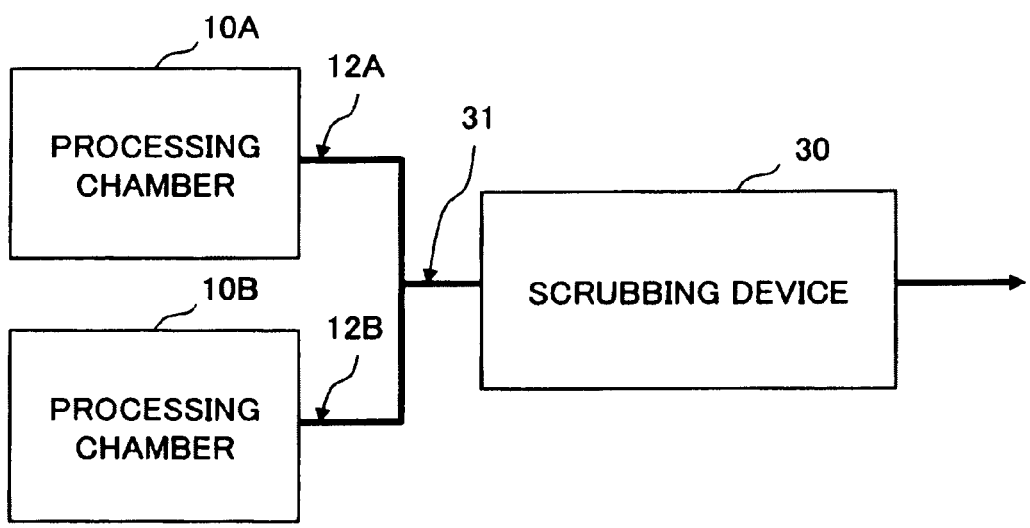
FIG. 25 is a block diagram presenting another example of a substrate processing apparatus in the related art, which includes a scrubbing device.

Once the predetermined length of time elapses, the downstream-side gas supply valve 646 at the high flow rate supply system 630 is closed in step S418 so as to drawn in the inert gas from the low flow rate supply system 640 alone, as shown in FIG. 23.

Next, voltage application control is executed in step S420. The voltage application control executed in this step may be similar to that executed in step S320. Next, the supply of the inert gas is stopped in step S422 and the roughing vacuum processing ends in step S424. More specifically, the upstream-side gas supply valve 624 and the downstream-side gas supply valve 646 in the inert gas supply system 620 are first closed to stop the supply of inert gas while roughing vacuum processing is in progress and the main valve 602 is still in an open state, and then the operation waits for a predetermined length of time to elapse. As a result, any residual particles remaining in the processing chamber can be removed. Once the predetermined length of time elapses, the auxiliary pump 250 is stopped and the roughing vacuum processing ends.

Next, main discharge processing is executed in step S426 by driving the main pump 260 and thus, the sequence of the second NPPC processing ends. It is to be noted that the second NPPC processing may be repeatedly executed over a predetermined number of cycles.

During the particle reduction processing (NPPC) shown in FIG. 18, the NPPC processing is executed over two phases, i.e., the first NPPC executed in a low-pressure environment and the second NPPC executed in a high-pressure environment, which enables more efficient removal of particles and the like present in the processing chamber 200. In addition, during the second NPPC, a gas shock wave is generated as the inert gas ($N_2$ gas) is drawn into the processing chamber 200 at a high flow rate briefly over the predetermined length of time (e.g., 5 sec) and particles having become adhered to the inner walls of the processing chamber 200 and the like can be flaked off with a high level of efficiency with a gas shock wave.

In addition, if the processing to be executed in the processing chamber 200 does not at least require any discharge gas scrubbing and starts under high-pressure conditions (e.g., a pressure equal to or higher than 50 Torr (66.6 hPa)), the common discharge system 310 is switched to the non-scrubbing common discharge system 330 during the particle reduction processing (NPPC) in FIG. 18, but otherwise, the particle reduction processing (NPPC) in FIG. 18 is executed by switching the common discharge system 312 to the scrubbing common discharge system 320. Through these measures, it is ensured that no unnecessary onus is placed on the scrubbing device 300 during the particle reduction processing (NPPC) in FIG. 18.

Figure 21:
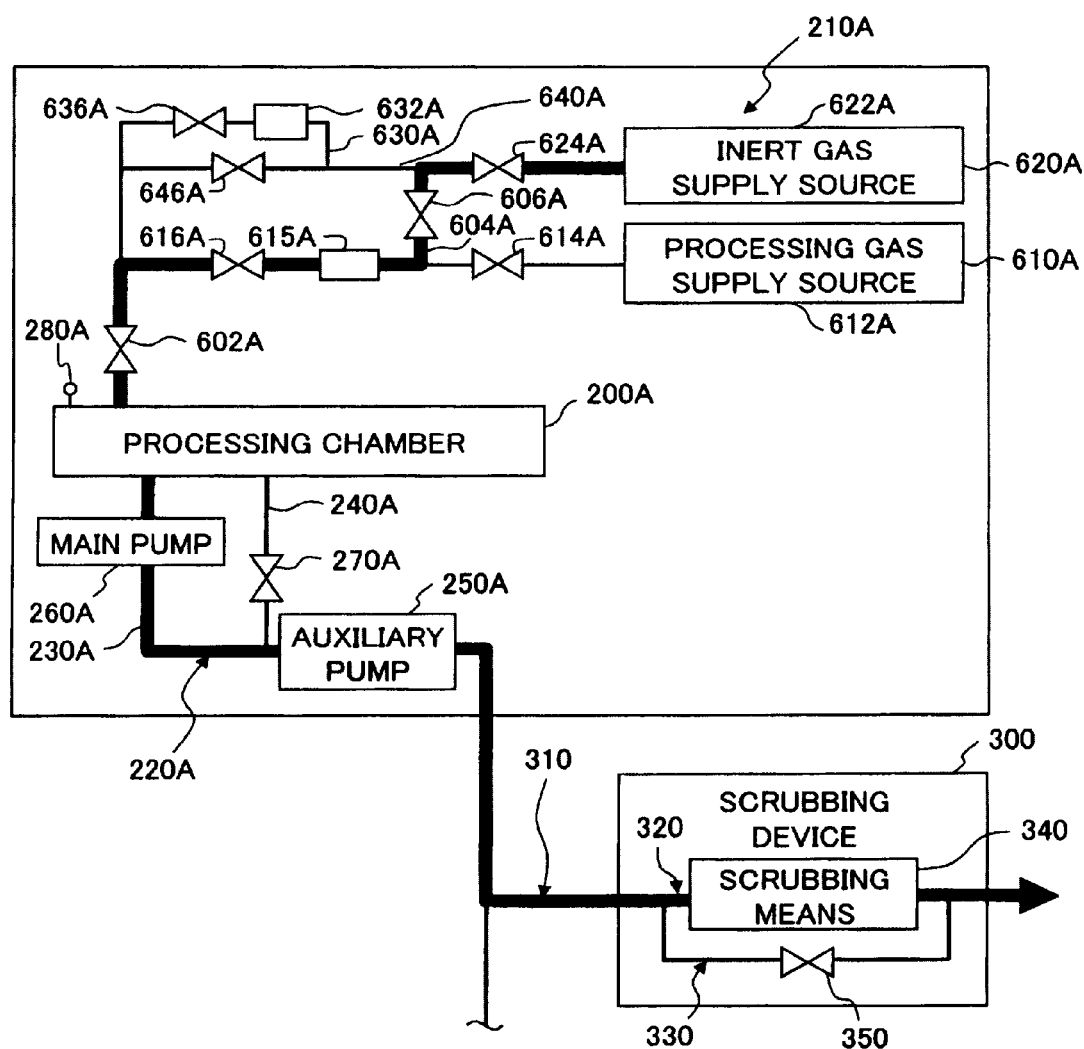
FIG. 21 illustrates a flow of discharge gas that may be observed when the first NPPC is executed at a processing chamber adopting the piping structure in FIG. 17.

When the first NPPC and the second NPPC constituting the particle reduction processing (NPPC) in FIG. 18 are simultaneously executed in a plurality of processing chambers under low-pressure conditions with pressure levels inside the individual processing chambers not exceeding, for instance, 50 Torr (66.6 hPa), the processing chambers will all be discharged via the scrubbing means 340 by switching the common discharge system 310 to the scrubbing common discharge system 320, as shown in FIGS. 21 through 23. For this reason, if the second NPPC is executed by continuously drawing in the inert gas at a high flow rate, as shown in FIG. 14 and the inert gas is continuously discharged at a high flow rate from the plurality of processing chambers simultaneously, the onus placed on the scrubbing device 300 is bound to increase.

However, the second NPPC in FIG. 20 is executed by only briefly drawing in the inert gas at a high flow rate instead of continuously drawing in the inert gas at a high flow rate. Thus, even if the second NPPC in FIG. 20 is simultaneously executed at a plurality of processing chambers, the inert gas is discharged from the processing chambers at a high flow rate only briefly, which greatly reduces the onus on the scrubbing device 300 compared to the onus that would be placed on the scrubbing device 300 by second NPPC executed by continuously drawing in the inert gas at a high flow rate.

It is to be noted that the particle reduction processing (NPPC) in FIG. 18 may be executed during, for instance, maintenance work. The particle reduction processing (NPPC) in FIG. 18 may also be executed over predetermined time intervals or after a predetermined number of wafers are processed during automatic inspection processing (auto-check processing). In the latter case, the purge processing executed by using the inert gas (e.g., $N_2$ gas) may be stopped before executing the main discharge processing (step S312) as part of the first NPPC in FIG. 19, information indicating that NPPC is in progress may be brought up at the display means 450, the information indicating that the NPPC is underway may be cleared from the display means 450 after the main discharge processing (step S426) is executed as part of the second NPPC in FIG. 20 and then the purge processing that uses the inert gas (e.g., $N_2$ gas) may be resumed.

For instance, if a setting for executing the particle reduction processing (NPPC in FIG. 18 over predetermined time intervals or after a predetermined number of wafers have been processed during automatic inspection processing (auto-check processing) is selected, the operation may shift into the particle reduction processing (NPPC) during batch processing of, for instance, 25 wafers constituting a single lot. Under such circumstances, if the operation needs to shift into the particle reduction processing (NPPC) while the purge processing is executed by using the inert gas (e.g., $N_2$ gas), the purge processing executed by using the inert gas must first be stopped. In the case of maintenance processing, on the other hand, the purge processing will have been completed before the operation shifts to maintenance processing and, accordingly, it is not necessary to go through the sequence of stopping the purge processing executed by using the inert gas and then resuming the purge processing.

In addition, the particle reduction processing (NPPC) in FIG. 18 may be executed in the load-lock chambers 160 as well as the processing chambers 200. The particle reduction processing (NPPC) may be repeatedly executed in the load-lock chambers 160 over a plurality of cycles.

The present invention described in detail above in reference to the embodiments may be adopted in a system constituted with a plurality of devices or in an apparatus constituted with a single device. It will be obvious that the present invention may be implemented by providing such a system or apparatus with a medium such as a storage medium having stored therein a software program for achieving the functions of the embodiments and by reading out and executing the program stored in a medium such as a storage medium at a computer (or a CPU or an MPU) constituting part of the system or the apparatus.

The functions of the embodiments described above are achieved in the program itself, read out from the medium such as a storage medium, whereas the present invention is embodied in the medium such as a storage medium having the program stored therein. The medium such as a storage medium in which the program is provided may be, for instance, a floppy (registered trademark) disk, a hard disk, an optical disk, a magneto-optical disk, a CD-ROM, a CD-R. a CD-RW, a DVD-ROM, a DVD-RAM, a DVD-RW, a DVD+

RW, magnetic tape, a nonvolatile memory card or a ROM, or it may be achieved in the form of a download via a network.

It is to be noted that the scope of the present invention includes an application in which an OS or the like operating on the computer executes the actual processing in part or in whole in response to the instructions in the program read out by the computer and the functions of the embodiments are achieved through the processing thus executed, as well as an application in which the functions of the embodiments are achieved as the computer executes the program it has read out.

The scope of the present invention further includes an application in which the program read out from the medium such as a storage medium is first written into a memory in a function expansion board loaded in the computer or a function expansion unit connected to the computer, a CPU or the like in the function expansion board or the function expansion unit executes the actual processing in part or in whole in response to the instructions in the program and the functions of the embodiment described above are achieved through the processing.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

For instance, while an explanation is given above in reference to the embodiments on an example in which the present invention is adopted in a cluster tool-type substrate processing apparatus that includes a processing unit achieved by connecting a plurality of processing chambers around a common transfer chamber, the present invention may also be adopted in any of various types of substrate processing apparatuses in which the operation stops upon the occurrence of an error in the apparatuses, such as a tandem-type substrate processing apparatus achieved by connecting in parallel a plurality of processing units to a transfer unit, with each processing unit having a processing chamber connected to a load-lock chamber.

What is claimed is:

1. An exhaust control method for controlling a substrate processing apparatus including a plurality of processing chambers, said exhaust control method comprising:

determining, by using a control unit controlling the plurality of processing chambers in communication with a plurality of pressure sensors, a plurality of discharge systems, a first switchover valve that switches between discharge through a main discharge system and discharge through an auxiliary discharge system, and a second switchover valve that switches between discharge through a scrubbing common discharge system and discharge through a non-scrubbing common discharge system, whether or not processing to be executed in one of the plurality of processing chambers is a predetermined type of processing based upon a pressure in said one of the processing chambers initially measured via one of the pressure sensors;

opening, by using the control unit, the second switchover valve so as to release exhaust gas from a common discharge system connected to the plurality of discharge systems through the non-scrubbing common discharge system without scrubbing the exhaust gas upon determining that the processing to be executed in the processing chamber is a first processing that is executed in a pressure condition higher than a predetermined pressure and that is executed with at least one of a process gas or an inert gas containing no toxics being evacuated from at least one of the processing chambers; and closing, by using the control unit, the second switchover valve, so as to scrub exhaust gas from the common discharge system through the scrubbing common discharge system upon determining that the processing to be executed in the processing chamber is a second processing that is executed in a pressure condition lower than the predetermined pressure and that is executed with said process gas containing said toxics being evacuated from at least one of the processing chambers;

executing exclusivity control, under which while the first processing is in progress in any of the processing chambers, the second processing is not executed in the other processing chambers, and while the second processing is in progress in any processing chamber, the first processing is not executed in the other processing chambers.

2. The control method according to claim 1, wherein the substrate processing apparatus includes an access right reservation information storage device that stores reservation information with regard to an access right of a given processing chamber to the common discharge system, and when either the first processing or the second processing is to be executed in a processing chamber among the plurality of processing chambers connected to the common discharge system, the step of executing the predetermined type of exclusivity control executed in each of the processing chambers includes:

making a decision as to whether or not one type of processing including either the first processing or the second processing, is currently being executed in another processing chamber among the plurality of processing chambers connected with the common discharge system; and executing the other type of processing if the one type of processing is judged not to be in progress in the other processing chamber, or executing reservation processing through which the other type of processing is set in a processing wait state, access right reservation information for the other type of processing with regard to an access right to the common discharge system is stored into the access right reservation information storage and then the other type of processing is executed based upon the reservation information in the access right reservation information storage device if the one type of processing is judged to be in progress in the other processing chamber.

3. The control method according to claim 2, wherein
the step of executing reservation processing enables execution of the other type of processing in the processing chamber having been set in the processing wait state, after the one type of processing in the other processing chamber is completed.

4. The control method according to claim 3, wherein
the step of reservation processing enables execution of the other type of processing in the order in which the plurality of sets of reservation information have been stored, if a plurality of sets of reservation information indicating access right reservations for the common discharge system corresponding to a plurality of processing chambers have been stored in the access right reservation information storage means device.

5. The control method according to claim 1, wherein
the first processing at least includes processing through which a subject processing chamber is discharged to a pressure level equal to or greater than a predetermined level without requiring discharge gas scrubbing and the second processing at least includes processing that generates discharge gas requiring scrubbing.

6. The control method according to claim 1, further comprising
supplying, through a gas supply system including a processing gas supply system and an inert gas supply system, a processing gas and an inert gas into each of the processing chambers, wherein
the inert gas supply system includes a first supply system through which the inert gas is supplied at a predetermined flow rate and a second supply system through which the inert gas is supplied at a flow rate higher than the flow rate set for the first supply system.

7. The control method according to claim 6, wherein
when executing particle reduction processing in the processing chamber, the inert gas is supplied at least via the second supply system.

8. The control method according to claim 7, wherein
the step of executing particle reduction processing is executed in the processing chamber by first supplying the inert gas at least via the second supply system over a predetermined length of time and then supplying the inert gas via the first supply system only.

9. The control method according to claim 1,
wherein, when said exclusivity control is executed in the plurality of processing chambers connected to the common discharge system while either
said first processing executed by switching the common discharge system to the non-scrubbing common discharge system or
said second processing executed by switching from the common discharge system to the scrubbing common discharge system is in progress in one of the plurality of processing chambers,
another type of processing is not executed in any of the remaining processing chambers among the plurality of processing chambers
executing exclusivity control, under which while the first processing is in progress in any of the processing chambers, the second processing is not executed in the other processing chambers, and while the second processing is in progress in any processing chamber, the first processing is not executed in the other processing chambers.

10. The control method according to claim 9, wherein
the substrate processing apparatus includes an access right reservation information storage device that stores reservation information with regard to an access right of a given processing chamber to the common discharge system, and
when either the first processing or the second processing is to be executed in a processing chamber among the plurality of processing chambers connected to the common discharge system, the step of executing the predetermined type of exclusivity control executed in each of the processing chambers includes:
making a decision as to whether or not one type of processing, including either the first processing or the second processing, is currently being executed in another processing chamber among the plurality of processing chambers connected with the common discharge system; and
executing the other type of processing if the one type of processing is judged not to be in progress in the other processing chamber, or
executing reservation processing through which the other type of processing is set in a processing wait state, access right reservation information for the other type of processing with regard to an access right to the common discharge system is stored into the access right reservation information storage and then the other type of processing is executed based upon the reservation information in the access right reservation information storage means device, if the one type of processing is judged to be in progress in the other processing chamber.

11. The control method according to claim 10, wherein
the step of executing reservation processing enables execution of the other type of processing in the processing chamber having been set in the processing wait state, after the one type of processing in the other processing chamber is completed.

12. The control method according to claim 11, wherein
the step of reservation processing enables execution of the other type of processing in the order in which the plurality of sets of reservation information have been stored, if a plurality of sets of reservation information indicating access right reservations for the common discharge system corresponding to a plurality of processing chambers have been stored in the access right reservation information storage device.

* * * * *